US011682737B2

(12) United States Patent
Lu et al.

(10) Patent No.: US 11,682,737 B2
(45) Date of Patent: Jun. 20, 2023

(54) LASER ASSISTED METALLIZATION PROCESS FOR SOLAR CELL FABRICATION

(71) Applicant: SunPower Corporation, San Jose, CA (US)

(72) Inventors: Pei Hsuan Lu, San Jose, CA (US); Benjamin I. Hsia, Fremont, CA (US); David Aaron Randolph Barkhouse, Oakland, CA (US); Lewis C. Abra, San Francisco, CA (US); George G. Correos, Corralitos, CA (US); Boris Bastien, Monte Sereno, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

(21) Appl. No.: 17/589,581

(22) Filed: Jan. 31, 2022

(65) Prior Publication Data
US 2022/0158001 A1 May 19, 2022

Related U.S. Application Data

(60) Division of application No. 16/377,053, filed on Apr. 5, 2019, now Pat. No. 11,276,785, which is a (Continued)

(51) Int. Cl.
H01L 31/02 (2006.01)
H01L 31/18 (2006.01)
H01L 31/05 (2014.01)

(52) U.S. Cl.
CPC ........ H01L 31/02008 (2013.01); H01L 31/18 (2013.01); H01L 31/1892 (2013.01); H01L 31/0516 (2013.01)

(58) Field of Classification Search
CPC ................. H01L 31/188; H01L 31/186; H01L 31/022433; H01L 31/022441;
(Continued)

(56) References Cited

U.S. PATENT DOCUMENTS 3,993,533 A 11/1976 Milnes et al.
4,058,418 A 11/1977 Lindmayer
(Continued)

FOREIGN PATENT DOCUMENTS

CN 102132423 7/2011
DE 10020412 11/2001
(Continued)

OTHER PUBLICATIONS

WO-2014023668-A1 English machine translation (Year: 2014).*
(Continued)

Primary Examiner — Andrew J Golden
(74) Attorney, Agent, or Firm — Schwabe, Williamson & Wyatt, P.C.

(57) ABSTRACT

A method for fabricating a solar cell and the and the resulting structures, e.g., micro-electronic devices, semiconductor substrates and/or solar cells, are described. The method can include: providing a solar cell having metal foil having first regions that are electrically connected to semiconductor regions on a substrate at a plurality of conductive contact structures, and second regions; locating a carrier sheet over the second regions; bonding the carrier sheet to the second regions; and removing the carrier sheet from the substrate to selectively remove the second regions of the metal foil.

6 Claims, 33 Drawing Sheets

Related U.S. Application Data continuation-in-part of application No. 16/376,802, filed on Apr. 5, 2019, now Pat. No. 11,362,220.

(60) Provisional application No. 62/773,168, filed on Nov. 29, 2018, provisional application No. 62/773,172, filed on Nov. 29, 2018, provisional application No. 62/773,148, filed on Nov. 29, 2018, provisional application No. 62/654,198, filed on Apr. 6, 2018.

(58) Field of Classification Search
CPC ........... H01L 31/05–0516; H01L 31/18; H01L 31/1892; H01L 31/02008
See application file for complete search history.

(56) References Cited

U.S. PATENT DOCUMENTS

| | | |
|---|---|---|
| 4,318,938 A | 3/1982 | Barnett et al. |
| 4,393,576 A | 7/1983 | Dahlberg |
| 4,400,577 A | 8/1983 | Spear |
| 4,433,200 A | 2/1984 | Jester et al. |
| 4,461,922 A | 7/1984 | Gay et al. |
| 4,482,780 A | 11/1984 | Mitchell |
| 4,581,103 A | 4/1986 | Levine et al. |
| 4,582,588 A | 4/1986 | Jensen et al. |
| 4,617,421 A | 10/1986 | Nath et al. |
| 4,691,076 A | 9/1987 | Levine et al. |
| 4,695,674 A | 9/1987 | Bar-on |
| 4,697,041 A | 9/1987 | Okaniwa et al. |
| 4,882,298 A | 11/1989 | Moeller et al. |
| 4,917,752 A | 4/1990 | Jensen et al. |
| 4,957,601 A | 9/1990 | Levine et al. |
| 5,091,319 A | 2/1992 | Hotchkiss et al. |
| 5,380,371 A | 1/1995 | Murakami |
| 5,951,786 A | 9/1999 | Gee et al. |
| 5,980,679 A | 11/1999 | Severin et al. |
| 6,159,832 A | 12/2000 | Mayer |
| 6,288,326 B1 | 9/2001 | Hayashi et al. |
| 6,448,155 B1 | 9/2002 | Iwasaki et al. |
| 6,635,307 B2 | 10/2003 | Huang et al. |
| 7,355,114 B2 | 4/2008 | Ojima et al. |
| 7,687,334 B2 | 3/2010 | Zou et al. |
| 8,003,530 B2 | 8/2011 | Grohe et al. |
| 8,146,643 B2 | 4/2012 | Kasahara et al. |
| 8,809,192 B2 | 8/2014 | Bertram et al. |
| 9,040,409 B2 | 5/2015 | Kumar et al. |
| 9,620,661 B2 | 4/2017 | Kim et al. |
| 2002/0159740 A1 | 10/2002 | Beall et al. |
| 2005/0253142 A1 | 11/2005 | Negami et al. |
| 2006/0166023 A1 | 7/2006 | Yoshikata et al. |
| 2006/0213548 A1 | 9/2006 | Bachrach et al. |
| 2008/0042153 A1 | 2/2008 | Beeson et al. |
| 2008/0128019 A1 | 6/2008 | Lopatin et al. |
| 2008/0216887 A1 | 9/2008 | Hacke et al. |
| 2008/0223429 A1 | 9/2008 | Everett et al. |
| 2009/0194162 A1 | 8/2009 | Sivaram et al. |
| 2009/0266399 A1 | 10/2009 | Bulent et al. |
| 2009/0305076 A1 | 12/2009 | Wong et al. |
| 2009/0314344 A1 | 12/2009 | Fork et al. |
| 2010/0032013 A1 | 2/2010 | Krause et al. |
| 2010/0084748 A1 | 4/2010 | Poddar et al. |
| 2010/0200058 A1 | 8/2010 | Funakoshi |
| 2010/0243041 A1 | 9/2010 | Carlson et al. |
| 2011/0076847 A1 | 3/2011 | Aqui et al. |
| 2011/0120752 A1 | 5/2011 | Imai et al. |
| 2011/0136265 A1 | 6/2011 | Shigenobu et al. |
| 2011/0186117 A1 | 8/2011 | Kumar et al. |
| 2012/0097245 A1 | 4/2012 | Nishina et al. |
| 2012/0103408 A1 | 5/2012 | Moslehi et al. |
| 2012/0240995 A1 | 9/2012 | Coakley |
| 2013/0068287 A1 | 3/2013 | Compaan |
| 2013/0112233 A1 | 5/2013 | Coakley |
| 2013/0160825 A1 | 6/2013 | Lantzer et al. |
| 2013/0183796 A1 | 7/2013 | Stewart et al. |
| 2013/0247977 A1 | 9/2013 | Kumai et al. |
| 2014/0113400 A1 | 4/2014 | Takahashi |
| 2014/0190546 A1 | 7/2014 | Fukumochi et al. |
| 2014/0338739 A1 | 11/2014 | Liu et al. |
| 2015/0325710 A1 | 11/2015 | Tu |
| 2016/0020343 A1* | 1/2016 | Carlson ........... H01L 31/022441 438/96 |
| 2016/0133759 A1 | 5/2016 | Pass et al. |
| 2016/0181447 A1 | 6/2016 | Kim et al. |
| 2017/0179312 A1 | 6/2017 | Kim et al. |
| 2017/0250297 A1 | 8/2017 | Harley |
| 2017/0365731 A1 | 12/2017 | Lin et al. |
| 2018/0097129 A1 | 4/2018 | Pass |

FOREIGN PATENT DOCUMENTS

| | | | |
|---|---|---|---|
| EP | 1634673 | 3/2006 | |
| JP | 2003/246971 | 9/2003 | |
| JP | 2009/130116 | 6/2009 | |
| JP | 2011/054831 | 3/2011 | |
| JP | 2012/501551 | 1/2012 | |
| KR | 10-1267398 | 1/2013 | |
| TW | 2010/27773 | 7/2010 | |
| WO | WO 1999/040760 | 8/1999 | |
| WO | WO 2010/025269 | 3/2010 | |
| WO | WO 2013/142892 | 10/2013 | |
| WO | WO-2014023668 A1 * | 2/2014 | ..... H01L 31/022425 |
| WO | WO 2016-036224 | 3/2016 | |

OTHER PUBLICATIONS

Cotter, et al., "Novel Process for Simplified Buried Contact Solar Cells," Institute of Electrical and Electronics Engineers, Aug. 2000, pp. 303-306.

Lu, et al., "Laser-Doping through Anodic Aluminum Oxide Layers for Silicon Solar Cells," Journal of Nanomaterials, vol. 2015, Article ID 870839, Jul. 1, 2015, 6 pages.

Nekarda, et al., "Laser-Based Foil Metallization for Industrial Pere Solar Cells," Presented at the 28th European Photovoltaic Solar Energy Conference and Exhibition; Paris, Sep. 30-Oct. 2013, 3 pgs.

Graf, et al., "Foil Metallization Process for Perc Solar Cells Towards Industrial Feasibility," Presented at the 31st European PV Solar Energy Conference and Exhibition, Sep. 14-18, 2015, Hamburg, Germany, 4 pgs.

Schulte-Huxel, et al., "Al-Foil on Encapsulantforthe Interconnection of Al-Metalized Silicon Solar Cells," Article in IEEE Journal of Photovoltaics—Jan. 2013, 7 pgs.

Schulte-Huxel, et al., "Laser microwelding of thin Al layers for interconnection of crystalline Si solar cells: analysis of process limits for ns and µs lasers," Article in Journal of Photonics for Energy—Aug. 2014, 15 pgs.

Schulte-Huxel, et al., "Aluminum-Based Mechanical and Electrical Laser Interconnection Process for Module Integration of Silicon Solar Cells," in IEEE Journal of Photovoltaics, vol. 2, No. 1, pp. 16-21, Jan. 2012, 6 pgs.

International Search Report and Written Opinion from PCT/US2019/026186 dated Jul. 25, 2019, 12 pgs.

Non-Final Notice of Reasons for Rejection from Japanese Patent Application No. 2018-182848 dated Oct. 16, 2019, 7 pgs.

International Preliminary Report on Patentability from PCT/US2019/026186 dated Oct. 15, 2020, 9 pgs.

First Action Interview Pilot Program Pre-Interview Communication Summary from U.S. Appl. No. 16/377,053 dated Nov. 12, 2020, 16 pgs.

First Action Interview Office Action Summary from U.S. Appl. No. 16/377,053 dated Feb. 16, 2021, 5 pgs.

Final Office Action from U.S. Appl. No. 16/377,053 dated Aug. 5, 2021, 13 pgs.

* cited by examiner

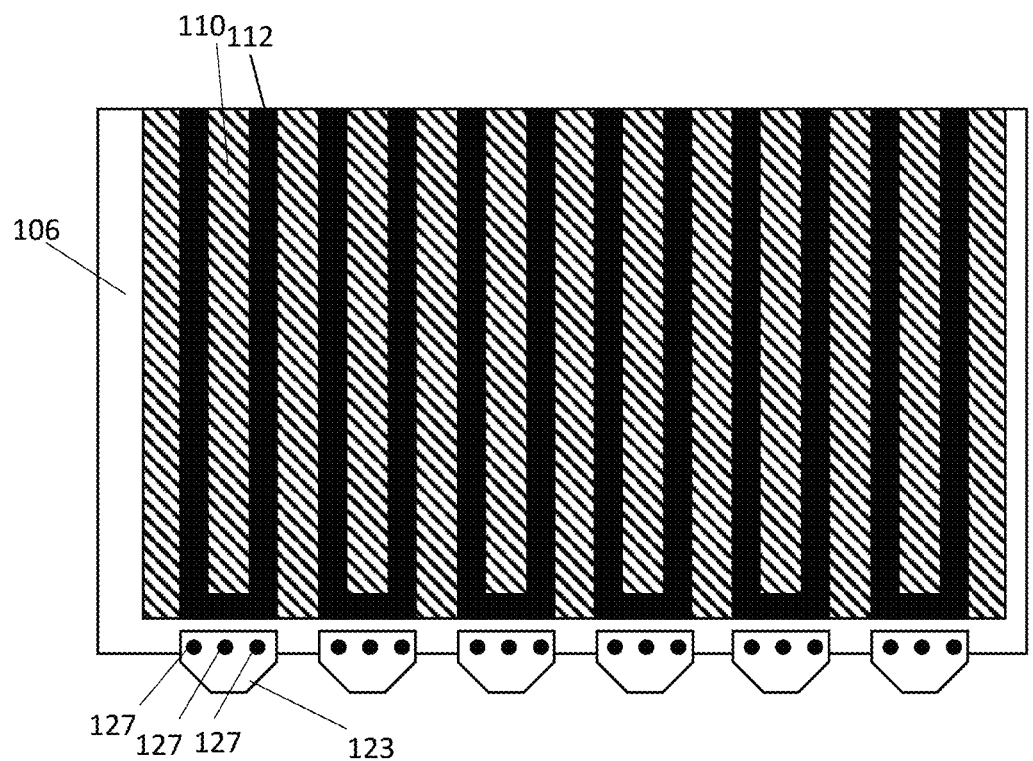
FIG. 4A
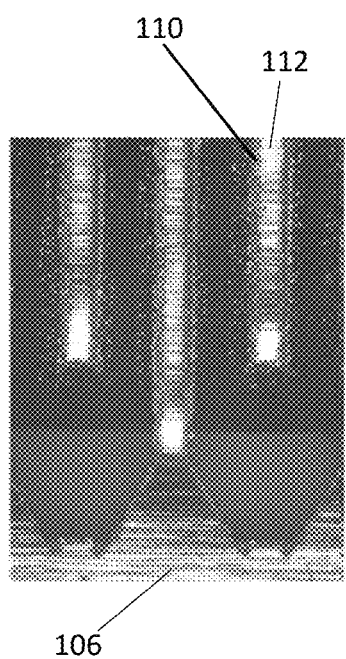
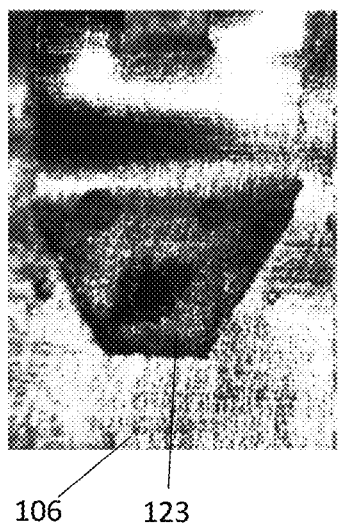
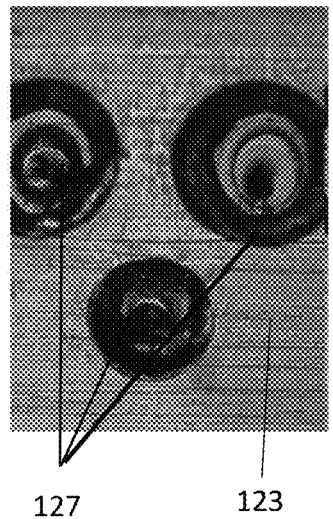
FIG. 4B  FIG. 4C  FIG. 4D

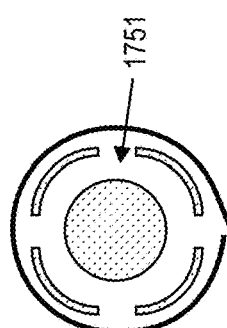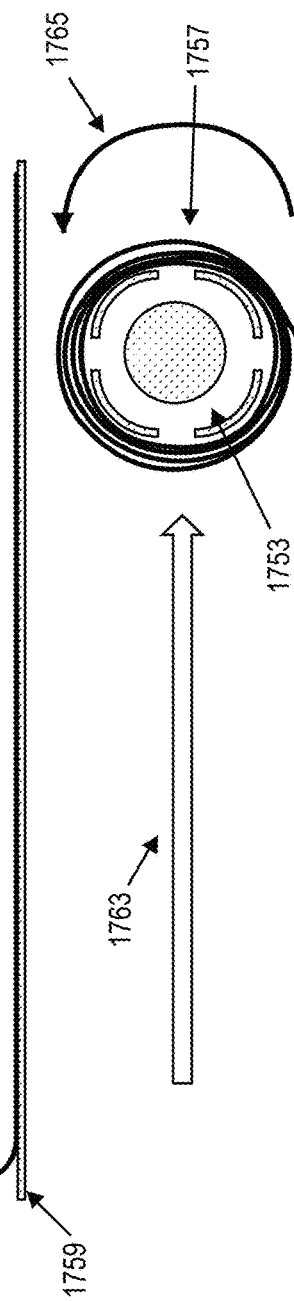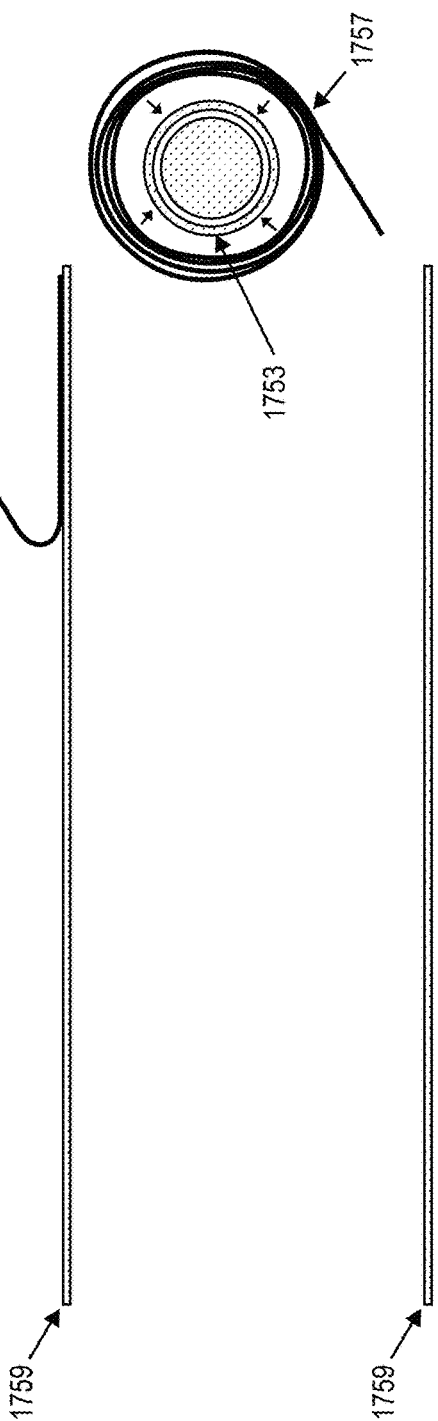
FIG. 13A
FIG. 13B
FIG. 13C

LASER ASSISTED METALLIZATION PROCESS FOR SOLAR CELL FABRICATION

CROSS-REFERENCE TO RELATED APPLICATIONS

This application is a Divisional of U.S. patent application Ser. No. 16/377,053, filed on Apr. 5, 2019, and claims the right of priority to and benefit of earlier filing date of U.S. Provisional Application No. 62/773,172, filed on Nov. 29, 2018, U.S. Provisional Application No. 62/773,168, filed on Nov. 29, 2018, U.S. Provisional Application No. 62/773,148, filed on Nov. 29, 2018, and U.S. Provisional Application No. 62/654,198, filed on Apr. 6, 2018, each of which is hereby incorporated by reference herein in its entirety. This application also claims the right of priority to and benefit of earlier filing of U.S. patent application Ser. No. 16/376,802, filed Apr. 5, 2019, titled "Local Metallization for Semiconductor Substrates using a Laser Beam," which is hereby incorporated by reference in its entirety.

TECHNICAL FIELD

Embodiments of the present disclosure are in the field of renewable energy or semiconductor processing and, in particular, include local metallization of semiconductor substrates using a laser beam, and the resulting structures.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Electrical conversion efficiency is an important characteristic of a solar cell as it is directly related to the capability of the solar cell to generate power; with higher efficiency providing additional value to the end customer; and, with all other things equal, higher efficiency also reduces manufacturing cost per Watt. Likewise, simplified manufacturing approaches provide an opportunity to lower manufacturing costs by reducing the cost per unit produced. Accordingly, techniques for increasing the efficiency of solar cells and techniques for simplifying the manufacturing of solar cells are generally desirable.

BRIEF DESCRIPTION OF THE DRAWINGS

FIG. 4A illustrates a solar cell showing the placement of tabs to remove excess metal foil from the solar cell.

FIGS. 4B-4D are digital images showing the placement of tabs to remove excess metal foil from the solar cell.

FIGS. 13A-13C illustrate a schematic of foil removal using an expanding mandrel.

DETAILED DESCRIPTION

Figure 1:
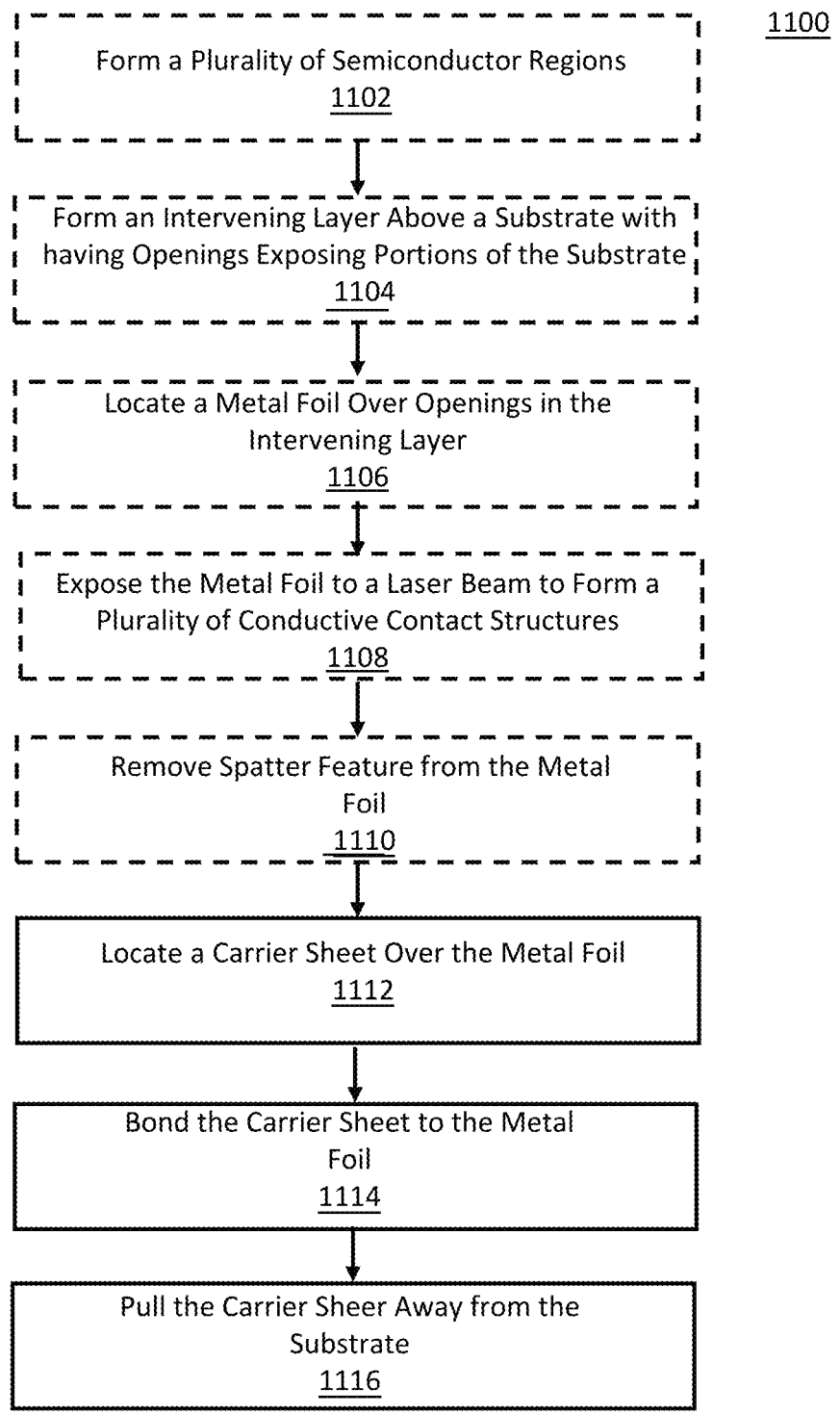
FIG. 1 illustrates an exemplary work flow for fabricating a solar cell.

The following detailed description is merely illustrative in nature and is not intended to limit the embodiments or the application and uses of such embodiments. As used herein, the word "exemplary" means "serving as an example, instance, or illustration." Any implementation described herein as exemplary is not necessarily preferred or advantageous over other implementations. Furthermore, there is no intention to be bound by any expressed or implied theory presented in the preceding technical field, background, brief summary or the following detailed description.

References to "one embodiment" or "an embodiment" do not necessarily refer to the same embodiment. Particular features, structures, or characteristics can be combined in any suitable manner consistent with this disclosure.

Terminology. The following paragraphs provide definitions and/or context for terms found in this disclosure (including the appended claims):

"Regions" or "portions" describe discrete areas, volumes, divisions or locations of an object or material having definable characteristics but not always fixed boundaries.

"Comprising" is an open-ended term that does not foreclose additional structure or steps.

"Configured to" connotes structure by indicating a device, such as a unit or a component, includes structure that performs a task or tasks during operation, and such structure is configured to perform the task even when the device is not currently operational (e.g., is not on/active). A device "configured to" perform one or more tasks is expressly intended to not invoke a means or step plus function interpretation under 35 U.S.C. § 112, (f) or sixth paragraph.

"First," "second," etc. terms are used as labels for nouns that they precede, and do not imply any type of ordering (e.g., spatial, temporal, logical, etc.). For example, reference to a "first" solar cell does not necessarily mean such solar cell is the first solar cell in a sequence; instead the term "first" is used to differentiate this solar cell from another solar cell (e.g., a "second" solar cell).

"Coupled" refers to elements, features, structures or nodes, unless expressly stated otherwise, that are or can be directly or indirectly joined or in communication with another element/node/feature, and not necessarily directly mechanically joined together.

"Inhibit" describes reducing, lessening, minimizing or effectively or actually eliminating something, such as completely preventing a result, outcome or future state completely.

"Exposed to a laser beam" describes a process subjecting a material to incident laser light, and can be used interchangeably with "subjected to a laser," "processed with a laser" and other similar phrases.

"Doped regions," "semiconductor regions," and similar terms describe regions of a semiconductor disposed in, on, above or over a substrate. Such regions can have a N-type conductivity or a P-type conductivity, and doping concentrations can vary. Such regions can refer to a plurality of regions, such as first doped regions, second doped regions, first semiconductor regions, second semiconductor regions, etc. The regions can be formed of a polycrystalline silicon on a substrate or as portions of the substrate itself.

"Thin dielectric layer," "tunneling dielectric layer," "dielectric layer," "thin dielectric material" or intervening layer/material refers to a material on a semiconductor region, between a substrate and another semiconductor layer, or between doped or semiconductor regions on or in a substrate. In an embodiment, the thin dielectric layer can be a tunneling oxide or nitride layer of a thickness of approximately 2 nanometers or less. The thin dielectric layer can be referred to as a very thin dielectric layer, through which electrical conduction can be achieved. The conduction can be due to quantum tunneling and/or the presence of small regions of direct physical connection through thin spots in the dielectric layer. Exemplary materials include silicon oxide, silicon dioxide, silicon nitride, and other dielectric materials.

"Intervening layer" or "insulating layer" describes a layer that provides for electrical insulation, passivation, and inhibit light reflectivity. An intervening layer can be several layers, for example a stack of intervening layers. In some contexts, the intervening layer can be interchanged with a tunneling dielectric layer, while in others the intervening layer is a masking layer or an "antireflective coating layer" (ARC layer). Exemplary materials include silicon nitride, silicon oxynitride, silicon oxide (SiOx) silicon dioxide, aluminum oxide, amorphous silicon, polycrystalline silicon, molybdenum oxide, tungsten oxide, indium tin oxide, tin oxide, vanadium oxide, titanium oxide, silicon carbide and other materials and combinations thereof. In an example, the intervening layer can include a material that can act as a moisture barrier. Also, for example, the insulating material can be a passivation layer for a solar cell. In an example the intervening layer can be a dielectric double layer, such as a silicon oxide ($SiO_x$), for example with high hydrogen content, aluminum oxide ($Al_2O_3$) dielectric double layer.

"Locally deposited metal" and "metal deposition" are used to describe forming a metal region by exposing a metal source to a laser that forms and/or deposits metal from the metal source onto portions of a substrate. This process is not limited to any particular theory or mechanism of metal deposition. In an example, locally deposited metal can be formed upon exposure of a metal foil to a laser beam that forms and/or deposits metal from the metal foil, such as all of the metal foil exposed to the laser beam, onto portions of a silicon substrate. This process can be referred to as a "Laser Assisted Metallization Patterning" or LAMP technique. The locally deposited metal can have a thickness of 1 nanometers (nm) to 20 microns (μm), a width approximately defined by the laser beam size, and physical and electrical properties matching those of the source metal foil.

"Patterning" refers to a process of promoting separation or separating portions of a source metal, and can specifically refer to weakening a region of a metal foil that is between a bulk of the metal foil and a deposited region of the metal foil (i.e., the deposited metal). This patterning can be the result of heat, perforation, deformation or other manipulation of the metal foil by the same laser process, LAMP, that deposits a metal foil onto a substrate, and can promote removal of the bulk of the metal foil (i.e., the non-deposited metal foil) from the resulting device. Unless expressed otherwise, references to LAMP includes such patterning.

"Substrate" can refer to, but is not limited to, semiconductor substrates, such as silicon, and specifically such as single crystalline silicon substrates, multi-crystalline silicon substrates, wafers, silicon wafers and other semiconductor substrates used for solar cells. In an example, such substrates can be used in micro-electronic devices, photovoltaic cells or solar cells, diodes, photo-diodes, printed circuit boards, and other devices. These terms are used interchangeably herein. A substrate also can be glass, a layer of polymer or another material.

"About" or "approximately". As used herein, the terms "about" or "approximately" in reference to a recited numeric value, including for example, whole numbers, fractions, and/or percentages, generally indicates that the recited numeric value encompasses a range of numerical values (e.g., +/−5% to 10% of the recited value) that one of ordinary skill in the art would consider equivalent to the recited value (e.g., performing substantially the same function, acting in substantially the same way, and/or having substantially the same result).

In addition, certain terminology can also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology can include the words specifically mentioned above, derivatives thereof, and words of similar import.

In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as emitter region fabrication techniques, are not described in detail in order to not unnecessarily obscure embodiments of the present disclosure. Furthermore, it is to be appreciated that the various embodiments shown in the figures are illustrative representations and are not necessarily drawn to scale.

Local metallization of substrates, for example semiconductor substrates, using a laser beam, and the resulting structures, e.g., micro-electronic devices, semiconductor substrates and/or solar cells, are described herein. In accordance with one or more embodiments of the present disclosure, a metal for a conductor contact is effectively deposited and patterned in a same operation. In one embodiment, a metal foil is placed over a surface of a substrate, such as a semiconductor solar cell. In an embodiment, portions of the metal foil are exposed to a laser beam to create localized heat for localized metal deposition while patterning the source metal foil layer. After deposition and patterning, the source of the metal layer, can be removed. In an example, portions of a metal foil not exposed to the laser beam can be removed. In a further example, portions of the metal foil exposed to another laser beam and/or exposed to a laser having different properties (e.g., power, frequency, etc.) can also be removed. Not to be bound by theory, the above described localized metal deposition achieved by exposing a metal foil to a laser beam can be achieved by partial or full melt of the laser irradiated portions of the metal foil, by partial or full ablation of portions of the metal foil with subsequent re-deposition onto the wafer surface, and/or by laser sputtering of portions of a metal foil during laser patterning of the metal foil. In an embodiment, first portions of the metal foil can be exposed to a laser beam to create localized heat for metal deposition from the metal foil (e.g., using the metal foil as a source) while patterning the source metal foil layer at the same time. In an embodiment, first portions of the metal foil can be exposed to a laser beam for metal deposition by laser sputtering of a metal foil. Additionally, certain implementations result in these first portions of the metal foil being fully or at least partially connected to adjacent second portions of the metal foil that have not been exposed to laser irradiation. Also, certain implementations result in these first portions of the metal foil being fully or at least partially connected to adjacent second portions exposed to a laser having different properties (e.g., power, frequency, etc.).

To further provide context, in a typical operation to deposit metal and pattern a metal layer for a semiconductor device (e.g., a solar cell), several operations can be performed. This can include use of a vacuum chamber for deposition or a chemical bath for plating. One or more patterning operations is also typically performed to identify regions where a deposited metal needs to be removed. By contrast, in accordance with one or more embodiments herein, the disclosed metallization approach effectively achieves metal deposition and patterning in a single process operation.

Advantages of implementing embodiments described herein can include less costly and faster metallization than using optical lithography (and omission of an associated etch process), and potentially more precise patterning with smaller feature width and higher aspect ratio compared to screen printing. The ability to directly deposit patterned metal using an inexpensive foil in a single operation process represents a significant cost advantage over competing technologies and, possibly, can enable the fabrication of relatively smaller features. For the latter advantage, tighter pitch and higher efficiency can be achieved as compared with structures typically formed using screen printing. In an example, screen printed conductive contacts can include silver paste having a thickness of up to 50 microns and a minimum feature size of 50 microns. In contrast, LAMP techniques can result in a thickness of approximately 1 nanometers to 20 microns and a minimum feature size of approximately 25 microns. The deposition thickness can be controlled by the starting thickness of the source material and the laser conditions. The deposited thickness can range from about 5% to about 25% of the source material thickness. The thickness of the source material partially constrains the laser conditions (in particular, the pulse duration) required for LAMP. The thickness of the source material partially constrains the laser conditions (in particular, the pulse duration) required for LAMP. In one embodiment, a metal source material can have a thickness in a range of approximately 1 nm to 1 In an example, performing laser assisted metallization process (LAMP) can include sputtering metal from a thin source material onto a thin polymer or membrane using a picosecond laser or a femtosecond laser, where the thin source material can have a thickness in a range of approximately 1 nm to 1 µm. In an embodiment, the metal source material can have a thickness in a range of 1 µm to 100 µm, such as 1 µm, to 10 µm, 5 µm to 25 µm, 10 µm to 50 µm, 25 µm to 75 µm, or 50 µm to 100 µm. In an example, performing laser assisted metallization process (LAMP) can include sputtering metal from a metal foil onto a substrate using a picosecond laser or a femtosecond laser, where the metal foil can have a thickness in a range of approximately 1 µm to 100 µm. In various implementations of the LAMP techniques disclose parameters for pre- and post-LAMP metal thickness are as described in Table 1.

TABLE 1

| | Pre-LAMP Foil Thickness | Post-LAMP Foil Thickness: Single Foil | Post-Processing Foil Thickness: One layer of a Foil Stack | Post-Processing Foil Thickness: Total of all layers of a Foil Stack (a LAMP layer and additionally bonded layers) |
|---|---|---|---|---|
| Target Thickness Examples | 10-50 µm | 1-10 µm in LAMP region 1-20 µm in LAMP region 10-50 µm or original thickness in non-LAMP region | 1-10 µm for initial LAMP layer 1-20 µm for initial LAMP layer 10-50 µm for additionally bonded layers 20-200 µm for additionally bonded layers | 10-50 µm 25-45 µm 25-200 µm 10-220 µm |

TABLE 1-continued

| | Pre-LAMP Foil Thickness | Post-LAMP Foil Thickness: Single Foil | Post-Processing Foil Thickness: One layer of a Foil Stack | Post-Processing Foil Thickness: Total of all layers of a Foil Stack (a LAMP layer and additionally bonded layers) |
|---|---|---|---|---|
| Practical Minimum Thickness Examples | 1 μm | 60 nm<br>100 nm | 100 nm<br>1 μm | 100 nm |
| Practical Maximum Thickness Examples | 100 μm | 12 μm<br>20 μm | 20 μm<br>200 μm | N/A |

Other advantages include providing a feasible approach to replace the use of silver with less costly aluminum (in the form of an aluminum foil) for metallization of semiconductor features. Furthermore, the aluminum deposited with a LAMP technique can be a pure, monolithic metal, in contrast to screen printed silver, which has higher electrical resistance due to its porosity. In addition to the examples of Table 1, in various examples utilizing aluminum as a metal foil, the solar cell can have a layer (or layers) of aluminum with a thickness of approximately 1 nm-500 μm. The metal foil can include aluminum in an amount greater than approximately 97% and silicon in an amount approximately in the range of 0-2%. In an example, performing laser assisted metallization process (LAMP) can include sputtering metal from a thin source material onto a thin polymer or membrane using a picosecond laser or a femtosecond laser, where the thin source material can having a thickness in a range of approximately 1 nm to 1 μm. In an embodiment, the metal source material can have a thickness in a range of 1 μm to 50 μm. In an example, performing laser assisted metallization process (LAMP) can include sputtering metal from a metal foil onto a substrate using a picosecond laser or a femtosecond laser, where the metal foil can have a thickness in a range of approximately 1 μm to 50 μm.

In an alternative example, an operation to form metal and pattern a metal layer for a semiconductor device (e.g., a solar cell) can include forming a first metal layer on a substrate (e.g., a metal seed layer), locating second metal layer over the first metal layer and bonding portions of the first metal layer to the second metal layer, e.g., through bonding or welding. In contrast, examples provided herein can include metal deposition and patterning over a surface of the semiconductor device (e.g., without a metal seed layer) in a single process operation. In some examples, as more thoroughly described herein, the metal deposition and patterning can be performed to another metal layer (e.g., a metal seed layer) located over a surface of the semiconductor device.

Metallization approaches described herein can be applicable for interdigitated back contact (IBC) solar cells as well as other types of solar cells including continuous emitter back contact solar, front and/or back contact solar cells having a trench architecture, e.g. were the n-type and p-type doped regions are separated by a trench structure thin-film, Heterojunction with Intrinsic Thin layer (HIT) Solar cells, Tunnel Oxide Passivated Contact (TOPCon) Solar Cells, organic and front-contact solar cells, front contact cells having overlapping cell sections, Passivated Emitter and Rear Cell (PERC) solar cells, mono-PERC solar cells, Passivated Emitter with Rear Locally-Diffused (PERL) cells, 3 or 4 terminal tandem cells, laminates and other types of solar cells. The metallization approaches described herein can be applicable for solar cells having a plurality of subcells coupled by metallization structures. In an embodiment, a groove can be located between adjacent sub-cells and a metallization structure can connect the adjacent sub-cells together. In an embodiment, the groove can singulate and physically separate one sub-cell from another, e.g., adjacent, sub-cell. In an embodiment, the metallization structure can physically and electrically connect the sub-cells, where the metallization structure can be located over the groove.

The metallization approaches described herein can be applicable for solar cells having a plurality of sub-cells coupled by metallization structures. In an embodiment, a groove can be located between adjacent sub-cells and a metallization structure can connect the adjacent sub-cells together. In an embodiment, the groove can singulate and physically separate one sub-cell from another, e.g., adjacent, sub-cell. In an embodiment, the metallization structure can physically and electrically connect the sub-cells, where the metallization structure can be located over the groove.

The metallization approaches described herein can also be applied to solar cells and/or solar cell portions which have been singulated and/or physically separated, e.g., diced, partially diced and further separated. In an example, these solar cells and/or solar cell portions can be joined together, either physically and/or electrically, by the metallization structures and processes described herein.

Metallization approaches described herein can also be applicable for micro-electronic, semiconductor devices and other substrates in general, such as light emitting diodes, microelectromechanical systems, patterning μm wire for heating purposes, and others. Embodiments described herein can be distinguished over a laser induced forward transfer (LIFT) process, where a film is deposited on glass and requires subsequent plating or the like to achieve a desired metal thickness.

Disclosed herein are methods of fabricating solar cells, that include methods of removing metal, such as excess metal foil from the solar cell. In one embodiment, a method of fabricating a solar cell includes providing a solar cell having metal foil electrically connected to semiconductor regions on a substrate at a plurality of conductive contact structures, for example as described below. In an embodiment, the method includes providing a solar cell having metal foil having a plurality of first regions that are electrically connected to semiconductor regions on a substrate at a plurality of conductive contact structures and a plurality of second regions that are not so connected. In an embodiment, the regions can be differentiated as those that include a locally deposited metal portion and those that do not. A carrier sheet is located over the substrate, and in particular, over regions of the substrate for which a metal foil is to be removed, such as over the plurality of second regions. The carrier sheet is bonded to the plurality of second regions in selected locations over the plurality of second regions. In embodiments, the carrier sheet is subjected to a laser beam in selected locations over positions or locations of the metal foil over the plurality of second regions. Subjecting the carrier sheet to the laser beam bonds the carrier sheet to the metal foil. The method further includes removing the carrier sheet from the substrate to selectively remove regions of the metal foil, for example, the plurality of second regions of the metal foil. By removing the carrier sheet, the metal foil that is bonded to the carrier sheet is selectively removed. In an embodiment, the metal foil that has formed a conductive contact structure that includes a locally deposited metal portion is removed, or at least a portion of such excess metal foil is removed. In an embodiment, in order to bond the carrier sheet with the metal foil, a tacking process is applied to the carrier sheet. In a specific such embodiment, the tacking process involves first forming an array of point or spot welds. The array of point or spot welds can be formed by thermocompression bonding, e.g., using spikes, a spiked roller, a porcupine roller, or a bed of nails. Alternatively, the locating can be performed using a laser welding process. In an embodiment, bonding of the carrier sheet to the metal foil includes selectively melting the carrier sheet. In an embodiment, bonding of the carrier sheet to the metal foil includes selectively spot welding the carrier sheet to the metal foil. In an embodiment, bonding of the carrier sheet to the metal foil includes selectively laser welding the carrier sheet to the metal foil. In an embodiment, the carrier sheet includes an adhesive and the laser beam selectively melts and/or activates the adhesive, for example, to bond the carrier sheet to the metal foil. In an embodiment, the carrier sheet includes a solder material and the laser beam selectively solders the carrier sheet to the metal foil. In certain embodiments, for example after laser assisted metallization as described below, the alignment of the laser assisted metallization is used to offset the laser process of bonding the carrier sheet to the metal foil.

In an embodiment, the carrier sheet is mechanically removed. In an embodiment, mechanically removing the carrier sheet includes pulling up one or more edges of the carrier sheet, for example with clamp(s), hook(s) or other mechanical means. In an embodiment, mechanically removing the carrier sheet includes clamping an edge of the carrier sheet.

In an embodiment, removing the carrier sheet tears the metal foil leaving an edge feature on the plurality of first regions. In certain embodiments the carrier sheet is scribed, such as laser scribed and portions of the carrier sheet that are not bonded to the metal foil are removed, for example prior to the removal of portions of the carrier sheet that are bonded to the metal foil. In another embodiment, the carrier is a plastic, polymer, and/or membrane, that can be used as an insulator, moisture barrier, protection layer and the like.

In an embodiment, removing the carrier sheet includes drawing up the carrier sheet by vacuum, such as a plate or roller vacuum. In still other embodiments, removing the carrier sheet includes using high pressure air or water that effectively gets under the carrier sheet and lifts it off. In other embodiments, method further includes welding a removal tab to the carrier sheet and pulling the removal tab to remove the carrier sheet.

In an embodiment, the carrier sheet is a metal foil. In an embodiment, the metal foil is aluminum (Al) metal foil has a thickness approximately in the range of 1-100 µm, for example in the range of 1-15 µm, 5-30 µm, 15-40 µm, 25-50 µm 30-75 µm, or 50-100 µm. The Al metal foil can be a temper grade metal foil such as, but not limited to, F-grade (as fabricated), O-grade (full soft), H-grade (strain hardened) or T-grade (heat treated). The aluminum metal foil can be anodized or not, and can include one or more coatings. Multilayer metal foils can also be used. Exemplary metal foils include metal foils of aluminum, copper, tin, tungsten, manganese, silicon, magnesium, zinc, lithium and combinations thereof with or without aluminum in stacked layers or as alloys. In an embodiment one or more removal tabs are connected, such as welded and or patterned, to the end the metal foil carrier sheet to aid in lifting and removal of the metal foil. In other embodiments, the carrier sheet is a polymer, such as a plastic that can be melted or otherwise coupled to the underlying metal to be removed. In another example the foil itself includes tabs, such as welded and or patterned, to the end the metal foil.

In one embodiment, a method of fabricating a solar cell includes providing a solar celling having first metal foil electrically connected to semiconductor regions on a substrate at a plurality of conductive contact structures, locating a second metal foil over the first metal foil, subjecting the second metal foil to a laser beam in selected locations over positions of the first metal foil that are not electrically connected to semiconductor regions. Subjecting the second metal foil to the laser beam connects the second metal foil to the first metal foil. Removing the second metal foil from the substrate selectively removes regions of the first metal foil that are not electrically connected to semiconductor regions on the substrate. In an embodiment, the carrier sheet is further used to provide additional metallization to a solar cell, for example to build or provide another or second layer of metal in selected regions of the metallization, such as for the construction of busbars were addition metal thickness could prove useful for conduction of electricity. In an embodiment, the carrier sheet, in this case a second metal foil is located over the solar cell substrate which includes regions or portion of localized metallization, such as formed from a first metal foil and including conductive contact structures which include a locally deposited metal portion in contact with the substrate. The second metal foil is bonded to the first metal foil in selected regions to provide additional metallization in these selected regions. In an embodiment the second metal foil is pattered, for example to increase metal thickness in some regions and to be used as a carrier sheet to remove the first metal foil in other regions. The second metal foil can be bonded to the first metal foil, for example. In an embodiment, in order to bond second metal foil with the first metal foil, a tacking process is applied to the second metal foil. In a specific such embodiment, the tacking process involves forming an array of point or spot welds. The array of point or spot welds can be formed by thermocompression bonding, e.g., using spikes, a spiked roller, a porcupine roller, or a bed of nails. In an embodiment, bonding of the second metal foil to the first metal foil includes selectively laser welding the second metal foil to the first metal foil. In an embodiment, the second metal foil includes a conductive adhesive to bond the second metal foil to the first metal foil. In an embodiment, the second metal foil is soldered to the first metal foil. In an embodiment, the second metal foil is exposed to a laser beam to form conductive contact structures to attach the second metal foil to the underlying first metal foil.

In an embodiment, the substrate can include doped regions. In an embodiment, the doped regions can include doped regions disposed in, above or over the substrate. In an embodiment, the doped regions can also be referred to as semiconductor regions. In an embodiment, the doped regions can have a N-type conductivity type or a P-type conductivity type. In an embodiment, the substrate can have a front side and a back side, where the back side is opposite the front site. In an embodiment, the doped regions can be located on the front side, the back side of the substrate or a combination thereof. In an example, N-type or P-type semiconductor regions can be in or above the substrate or both.

In an embodiment, the substrate can have a plurality of doped regions. In an embodiment, the plurality of doped regions can be referred to as a first doped region, a second doped region, etc. In an example, the first doped region can include an N-type semiconductor region and the second doped region can include a P-type semiconductor region. In an example, the substrate can include a plurality of N-type and P-type semiconductor regions. In some embodiments, the N-type and P-type semiconductor regions can be alternating N-type and P-type semiconductor regions. In an embodiment, the alternating N-type and P-type semiconductor regions can be placed one after another or occurring repeatedly, e.g., as interdigitated fingers.

In embodiments, methods described herein can include forming a plurality of N-type and P-type semiconductor regions in or above a substrate. Also, in an example, a method of fabricating a solar cell can include forming a plurality of N-type or P-type semiconductor regions in or above one side of the substrate. In an embodiment, the method can include placing N-type and P-type semiconductor regions on the front side, the back side of the substrate or on both.

In an embodiment, the power, wavelength and/or pulse duration of a laser can be selected to form the plurality of conductive contact structures electrically connected to the substrate, each conductive contact structure including a locally deposited metal portion. The power, wavelength and/or pulse duration of a laser are so as not to fully ablate the foil, but rather as mentioned above, provide the energy to deposit a portion of the metal foil onto the substrate. The power, wavelength and/or pulse duration can be tuned, for example in conjunction with the foil to be deposited, for example, based on composition, melting temperature and/or thickness to form the plurality of conductive contact structures electrically connected to the substrate. In an example, the power, wavelength and/or pulse duration of a laser for a LAMP technique are selected so as to form a plurality of locally deposited metal portions, but not to fully ablate the foil. The power, wavelength and/or pulse duration of a laser for a LAMP technique are selected so as to form a plurality of locally deposited metal portions, but not to fully ablate the foil. The power, wavelength and/or pulse duration can be selected/tuned based on the metal foil composition, melting temperature and/or thickness. In an example, the laser has a wavelength of between about 250 nm and about 2000 nm (such as wavelength of 250 nm to 300 nm, 275 nm to 400 nm, 300 nm to 500 nm, 400 nm to 750 nm, 500 nm to 1000 nm, 750 nm to 1500 nm, or 1000 nm to 2000 nm), the laser peak power is above $5 \times 10^{+4}$ W/mm$^2$, and the laser is a pulse laser with a pulse frequency of about 1 kHz and about 10 MHz (such as about 1 kHz and about 10 MHz, such a 1 kHz to 1000 kHz, 500 kHz to 2000 kHz, 1000 kHz to 5000 kHz, 2000 kHz to 7500 kHz, or 5000 kHz to 10 mHz. The pulse duration can be between 1 fs to 1 ms, such as 1 fs to 250 fs, 100 fs to 500 fs, 250 fs to 750 fs, 500 fs to 1 ns, 750 fs to 100 ns, 1 ns to 250 ns, 100 ns to 500 ns, 250 ns to 750 ns, 500 ns to 1000 ns, 750 ns to 1500 ns, 1000 ns to 5000 ns, 1500 ns to 10000 ns, 5000 ns to 100000 ns, 10000 ns to 500000 ns, and 100000 to 1 ms. The laser can be an IR, Green or a UV laser. In certain examples, the laser beam has a width of between about 20 µm and about 50 µm, such as 20-30 µm, 25-40 µm, and 30-50 µm.

In an embodiment, a method of fabricating a solar cell can include forming semiconductor regions in or above a substrate. In embodiments, an intervening layer can be formed on the semiconductor regions, the intervening layer having openings exposing portions of the semiconductor regions. In embodiments, a metal foil can be located over the intervening layer. In embodiments, the metal foil can be exposed to a laser beam in locations over, partially over, offset from or adjacent to the openings in the intervening layer. In embodiments, exposing the metal foil to the laser beam forms a plurality of conductive contact structures electrically connected to the semiconductor regions, each conductive contact structure including a locally deposited metal. In embodiments, the method can include laser sputtering the metal foil in locations over the openings in the intervening layer. In embodiments, the laser sputtering can form a plurality of conductive contact structures electrically connected to the semiconductor regions.

After the removal of portions of the metal foil the resulting metal structure can include an edge feature, such as an edge feature formed by physically separating, breaking or tearing the metal from the portions deposited on the substrate. In an embodiment, the edge feature comprises a torn edge. In an embodiment, the edge feature comprises a sharp torn edge. By way of example, in an exemplary embodiment, a layer of a metal foil such as aluminum foil is placed on a surface of a solar cell for both metal deposition and/or patterning, which can be performed in a single process and referred to as localized metal deposition. First portions of the metal (aluminum foil in this example) are deposited or directly secured to the surface of the solar cell, whereas second portions (which are adjacent to the first portions) of the metal are not deposited or directly secured to the surface of the solar cell. The first and second portions of the metal foil are attached to each other. Following this local deposition (the aluminum deposition and patterning in this example), the second portions of the metal, which are unattached to the surface of the solar cell and not exposed to local deposition, can be removed and physically separated or torn away from the first portions. This separation can result in an edge structure along sides of the first portions. Thus, the locally deposited metal structure can have an edge feature, such as an edge feature formed by physically separating or breaking a metal structure. As metal that is not part of the conductive contact structure is removed, for example torn or ripped from the conductive contact structure, an edge feature can be left behind. In embodiments, this edge feature can have sharp and/or torn edge, which can be differentiated from the round edge of a metallization feature left behind from welding or soldering of metal to a substrate. Exposing the foil to the laser beam can also form other features that are unique to the methods disclosed herein, including a "U-shaped" structure or valley where the laser beam has contacted the foil. The width of the "U-shaped" can be approximately equal to the width of the laser beam used. In an embodiment, the conductive contact structures are connected, at least temporarily until the removal of the regions not exposed to the laser beam, by edge portions that extend from the conductive contact structure to regions of the metal foil not exposed to the laser beam.

In an embodiment, exposing the metal foil to the laser beam forms a spatter feature on the solar cell, for example on the foil and/or substrate. Such a spatter feature can be used to determine if the solar cell was formed using one or more of the processes disclosed herein, for example as differentiated from a welding or soldering process. In embodiments, the spatter feature is removed from at least the metal foil, for example, to facilitate bonding of a second material to the foil, such as a carrier sheet used to remove that foil that has not been exposed to the laser beam, or other components of a solar cell, solar cell string, or higher order structure, such as an interconnect, foil extending from another cell, or other electrically or non-electrically connected component of a solar cell, solar cell string, or higher order structure.

Also disclosed herein are solar cells. In one embodiment, a solar cell includes a substrate and semiconductor regions disposed in or above the substrate. A plurality of conductive contact structures is electrically connected to the plurality of semiconductor regions. Each conductive contact structure includes a metal structure disposed, for example a locally deposited metal structure, in direct contact with a corresponding one of semiconductor regions. In some embodiments, the conductive contact structures can be located on a back side, a front side or both the front and back sides of the solar cell. In embodiment, the metal structure includes a "U" shaped portion, for example as left behind for the laser deposition process disclosed herein, see e.g. FIG. 2A. In an embodiment, each of the metal structures is an aluminum structure. In an embodiment, the metal structure has an edge feature, such as an edge feature formed by physically separating or breaking metal from the metal structure. As metal that is not part of the conductive contact structure is removed, for example torn or ripped from the conductive contact structure, an edge feature is left behind. In embodiments, this edge feature has a sharp edge, which can be differentiated from the round edge of a metallization feature left behind from welding of metal to a substrate. In an embodiment, the edge feature comprises a sharp edge. In an embodiment, the edge feature comprises a torn edge. Although, in an embodiment, an edge feature can exist, e.g., due to tearing and/or removal of excess foil, in an embodiment, the conductive contact structure does not include an edge feature. In an embodiment, the solar cell includes a spatter feature, for example, on the surface of the substrate and/or metal foil. In an embodiment, the solar cell includes a metal foil portion disposed over an intervening layer, for example appearing to float above the intervening layer. In an embodiment, the metal foil portion is in contact with one of the metal structures.

In an embodiment, the solar cell includes doped regions, e.g., N-type and P-type semiconductor regions. In an embodiment, the solar cell can include a plurality of doped regions, e.g., a first doped region, a second doped region, etc. In an embodiment, the solar cell includes a plurality of N-type and P-type semiconductor regions. In some examples, the N-type and P-type semiconductor regions are alternating N-type and P-type semiconductor, e.g., placed one after another or occurring repeatedly, for example as interdigitated fingers. In an embodiment, the plurality of N-type and P-type semiconductor regions is a plurality of N-type and P-type polycrystalline silicon regions disposed above the substrate. In an embodiment, the plurality of N-type and P-type semiconductor regions is a plurality of N-type and P-type diffusion regions disposed in the substrate. In an embodiment, an intervening layer is disposed on portions of the plurality of alternating N-type and P-type semiconductor regions, wherein the metal structures are confined to openings in the intervening layer. In another embodiment, a solar cell includes a substrate and semiconductor regions disposed in or above the substrate. A plurality of conductive contact structures is electrically connected to the plurality of semiconductor regions. Each conductive contact structure includes a locally deposited metal portion disposed in direct contact with a corresponding one of semiconductor regions.

In an embodiment, each conductive contact structure includes a locally deposited metal portion disposed in contact with a metal layer in contact with semiconductor regions. In an example, each conductive contact structure includes a locally deposited metal portion disposed in contact with a metal layer in contact with a corresponding one of the alternating N-type and/or P-type semiconductor regions. In an embodiment, the metal layer can be a metal seed layer. In an example, a metal seed layer can include a layer of deposited tin, tungsten, titanium, copper, and/or aluminum. In an example, a sputtering process can be used to deposit the metal seed layer. In an embodiment, the metal seed layer can have a thickness in a range of 0.05-50 microns.

In an example, the above referenced semiconductor regions include a plurality of N-type and P-type semiconductor regions disposed in or above the substrate. In another example, the semiconductor regions include a plurality of N-type or P-type semiconductor regions in or above one side of a substrate (e.g., a front side and/or a back side of the substrate). In an example where the semiconductor regions include a plurality of N-type or P-type semiconductor regions in or above one side of a substrate, another plurality of N-type or P-type semiconductor regions can be disposed in or above another side of the substrate (e.g., as in a front contact solar cell). In one example, the plurality of N-type or P-type semiconductor regions can be disposed in or above both sides, e.g., the front and back side of the semiconductor substrate.

In an embodiment, a solar cell is an interdigitated back contact (IBC) solar cell. In an embodiment, a solar cell is a continuous emitter back contact solar, contact solar cells having a trench architecture, e.g. where the n-type and p-type doped regions are separated by a trench structure, thin-film solar cells, Heterojunction with Intrinsic Thin layer (HIT) Solar cells, Tunnel Oxide Passivated Contact (TOPcon) Solar Cells, organic and front-contact solar cells, front contact cells having overlapping cell sections, Passivated Emitter and Rear Cell (PERC) solar cells, mono-PERC solar cells, PERL cells, 3 or 4 terminal tandem cells, laminates and other types of solar cells. In an embodiment, a solar cell has a plurality of sub-cells, for example as cleaved from a larger substrate.

Also disclosed herein are methods of fabricating semiconductor devices. In one embodiment, a method of fabricating a semiconductor device includes forming semiconductor regions in or above a substrate, locating a metal foil over the substrate, patterning the metal foil in locations over the semiconductor regions. The patterning forms a plurality of conductive contact structures electrically connected to the semiconductor regions, each conductive contact structure including a locally deposited metal portion, and removing non-patterned portions of the metal foil.

Also disclosed herein are semiconductor devices. In one embodiment, a semiconductor device includes a substrate. A plurality of semiconductor regions is disposed in or above the substrate. A plurality of conductive contact structures is electrically connected to the semiconductor regions, each conductive contact structure including a locally deposited metal portion disposed in direct contact with a corresponding one of the semiconductor regions.

Also disclosed herein are methods of fabricating micro-electronic devices. In one embodiment, a method of fabricating a micro-electronic device includes locating a metal foil over a substrate, patterning portions of the metal foil over the substrate, where the patterning forms a plurality of conductive contact structures electrically connected to micro-electronic device. Each conductive contact structure includes a locally deposited metal portion. The method also includes removing non-patterned portions of the metal foil.

Also disclosed herein are micro-electronic devices. In one embodiment, a semiconductor device includes a substrate. A plurality of conductive contact structures is electrically connected to the substrate, each conductive contact structure including a locally deposited metal portion.

FIG. 1 illustrates an exemplary work flow for fabricating a solar cell in accordance with an embodiment of the present disclosure, the details of which will become apparent with reference to FIGS. 2A-3D. At operation 1112, the method involves locating a carrier sheet over a metal foil that is attached to a substrate at a plurality of first regions that are electrically connected to semiconductor regions on the substrate at a plurality of conductive contact structures, and a plurality of second regions, for example as provided by operations 1102-1110. At operation 1114, the method involves bonding the carrier sheet to the metal foil. At operation 1116, the method involves pulling the carrier sheet away from the substrate. Optionally or in addition to, at operation 1102, the method involves forming a plurality of semiconductor region in or above the substrate. Optionally or in addition to, at operation 1104, the method involves forming an intervening layer above a substrate, the intervening layer having openings exposing portions of the substrate. Optionally or in addition to, at operation 1106, the method involves locating a metal foil over the openings in the intervening layer. Optionally or in addition to, at operation 1108, the method involves exposing the metal foil to a laser beam, wherein exposing the metal foil to the laser beam forms a plurality of conductive contact structures electrically connected to exposed portions of the substrate. Optionally or in addition to, at operation 1110 the method involves removing a spatter feature from the metal foil not exposed to the laser beam.

FIGS. 2A-2D illustrate cross-sectional views of various operations in a method of fabricating a solar cell, in accordance with an embodiment of the present disclosure.

Figure 2A:
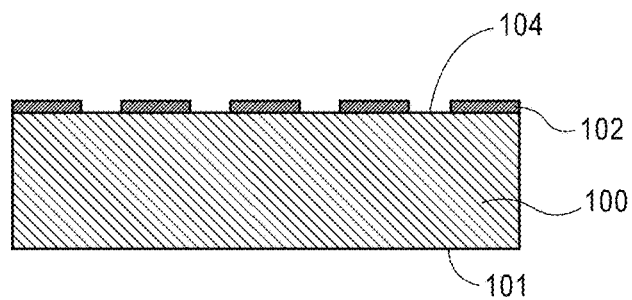
FIGS. 2A-2D illustrate cross-sectional views of various operations in a method of fabricating a solar cell.

Referring to FIG. 2A, an intervening layer 102 is formed on or above a solar cell substrate 100. Intervening layer 102 has openings 104 therein. While particular reference is made to forming the intervening layer on or above the substrate it is appreciated that the direction above is relative and that this intervening layer can be formed on the back, the front, or even the back and the front, of a selected substrate, for example, for metallization of the front, back, or both the front and back of the substrate.

In embodiments, intervening layer 102 can be either formed with openings 104 (e.g., patterned as deposited), or openings 104 are formed in a blanket-deposited intervening layer. In the latter case, in one embodiment, openings 104 are formed in intervening layer 102 by patterning with laser ablation and/or a lithography and etch process.

In an embodiment, intervening layer 102 can be formed on a backside of substrate 100 opposite a light-receiving side 101 of the substrate 100. Embodiments can include formation of a passivation and/or intervening layers (e.g., anti-reflective coating ARC) on the back side of the substrate 100. In one such embodiment, the intervening layer 102 can a back anti-reflective layer (BARC).

In an embodiment, not shown, the light receiving surface 101 is a texturized light-receiving surface. In one embodiment, a hydroxide-based wet etchant can be employed to texturize the light receiving surface 101 of the substrate 100. In an embodiment, a texturized surface can be one which has a regular or an irregular shaped surface for scattering incoming light, decreasing the amount of light reflected off of the light receiving surface 101 of the solar cell. Embodiments can include formation of a passivation and/or insulating (e.g., anti-reflective coating ARC) layers on the light-receiving surface 101.

While particular attention is paid to back-contact solar cells it is appreciated that the methods and techniques discussed herein can be applied to the metallization of a substrate in other solar cell types, such as front contact solar cells (e.g., PERC solar cells, mono-PERC solar cells, HIT solar cells, TopCon solar cells, (PERL) cells, and tandem cells, and other types of solar cells).

In an embodiment, openings 104 in intervening layer 102 can expose portions of a plurality of semiconductor regions formed in or above the substrate 100. In one such embodiment, openings 104 in intervening layer 102 can expose portions of a plurality of first semiconductor regions and second semiconductor regions formed in or above the substrate 100. In an embodiment, the first semiconductor regions can be N-type semiconductor region and the second semiconductor region can be a P-type semiconductor region. In an embodiment, substrate 100 is a monocrystalline silicon substrate, such as a bulk single crystalline N-type doped silicon substrate. It is to be appreciated, however, that substrate 100 can be a layer, such as a multi-crystalline silicon layer, disposed on a global solar cell substrate. In one embodiment, substrate 100 can have disposed therein N-type doped regions and P-type doped regions (e.g., doped regions in the substrate), portions of which are exposed by openings 104 in intervening layer 102. In an embodiment, the intervening layer 102 can expose portions of a plurality of semiconductor regions of the same conductivity type formed in or above the substrate 100. In one such embodiment, openings 104 in intervening layer 102 can expose portions of a plurality of N-type or P-type semiconductor regions formed in or above the substrate 100. For example, in a front contact solar cell, the semiconductor regions on one side of the solar cell can be of the same conductivity type (e.g., P-type or N-type).

In accordance with an embodiment of the present disclosure, substrate 100 can have disposed there above semiconductor regions, portions of which are exposed by openings 104 in intervening layer 102. In an embodiment, the semiconductor regions can include a plurality of semiconductor regions, e.g., first semiconductor regions, second semiconductor regions, etc. In an embodiment, the first semiconductor regions can be N-type semiconductor regions and/or the second semiconductor regions can be P-type semiconductor regions. In some embodiments, the semiconductor regions can have the same conductivity type, e.g., are N-type or P-type semiconductor regions. The N-type semiconductor regions and/or P-type semiconductor regions can be disposed on a dielectric layer. In an example, the N-type semiconductor regions and/or P-type semiconductor regions can be disposed on dielectric layer including a thin dielectric material as an intervening material between the N-type semiconductor regions or P-type semiconductor regions, respectively, and the substrate 100. In an embodiment, the thin dielectric layer can be a tunneling oxide layer. In an embodiment, the dielectric layer can include a silicon oxide layer having a thickness of approximately 2 nanometers or less. In one such embodiment, the dielectric layer can be referred to as a very thin dielectric layer or a tunneling dielectric layer, through which electrical conduction can be achieved. The conduction can be due to quantum tunneling and/or the presence of small regions of direct physical connection through thin spots in the dielectric layer. In one embodiment, the dielectric layer can be or can include a thin silicon oxide layer. In an embodiment, the N-type and/or P-type semiconductor regions can be formed from polycrystalline silicon formed by, e.g., using a plasma-enhanced chemical vapor deposition (PECVD) process. In one such embodiment, the N-type polycrystalline silicon emitter regions are doped with an N-type impurity, such as phosphorus. The P-type polycrystalline silicon emitter regions are doped with a P-type impurity, such as boron. In an embodiment, the N-type and P-type semiconductor regions are separated from one another. In an example, the N-type and P-type semiconductor regions have trenches formed there between, the trenches extending partially into the substrate, and covered by intervening layer 102. In one example, N-type and P-type semiconductor regions are separated by a lightly doped region there between, e.g., where the lightly doped regions can have a doping concentration substantially less than the N-type and P-type semiconductor regions. In an embodiment, a dielectric layer, e.g., a tunnel oxide or silicon dioxide layer, can be located between the N-type and P-type semiconductor regions. In an example, the dielectric layer can be located laterally between the N-type and P-type semiconductor regions.

Figure 2B:
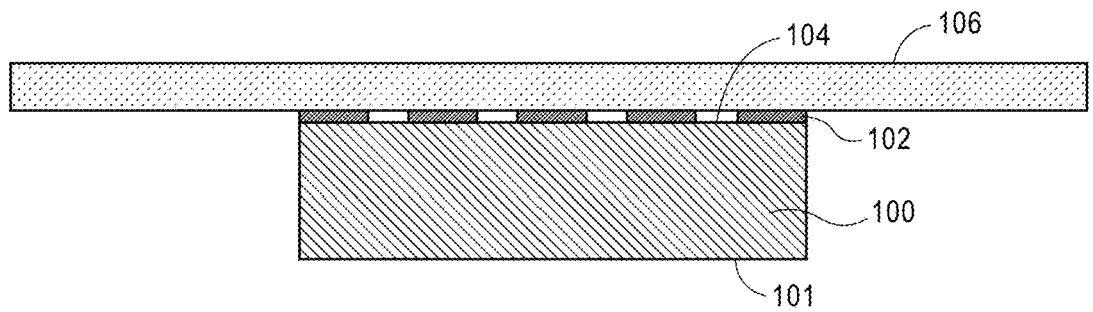

Referring to FIG. 2B, a metal foil 106 is located over the intervening layer 102. In an embodiment, locating the metal foil 106 over the intervening layer can include positioning the metal foil over the substrate 100. In an example, positioning the metal foil 106 over the substrate 100 can include covering the entire substrate 100. In an embodiment, portions of the metal foil 106 can be located over the substrate 100 and other portions can be located away, e.g., extend away from the substrate 100 in a lateral direction as shown in FIG. 2B. In an embodiment, in order to secure the metal foil 106 with the substrate 100, a locating process can be performed to include position the metal foil 106 over the substrate 100. In an embodiment, a vacuum and/or a tacking process can be used to hold the metal foil 106 in place over the substrate. In an example, the locating process can include performing a thermocompression process. In further example, a roller can be used to position or locate the metal foil 106 over the substrate 100. In an embodiment, the vacuum process, thermocompression process or other similar process can uniformly position the metal foil such that there are no air gaps or pockets of air between the metal foil and the substrate, as shown. In an example, a roller can be used to uniformly position the metal foil 106 over the substrate 100.

In an embodiment, at the time of locating the metal foil 106 and the substrate 100, the metal foil 106 can have a surface area substantially larger than a surface area of the solar cell. In another embodiment, however, prior to placing the metal foil 100 over the solar cell, a large sheet of foil can be cut to provide the metal foil 106 having a surface area substantially the same as a surface area of the substrate 100. The metal foil can be laser cut, water jet cut, and the like, for example, prior to or even after placement on or above the substrate 100.

Figure 2C:
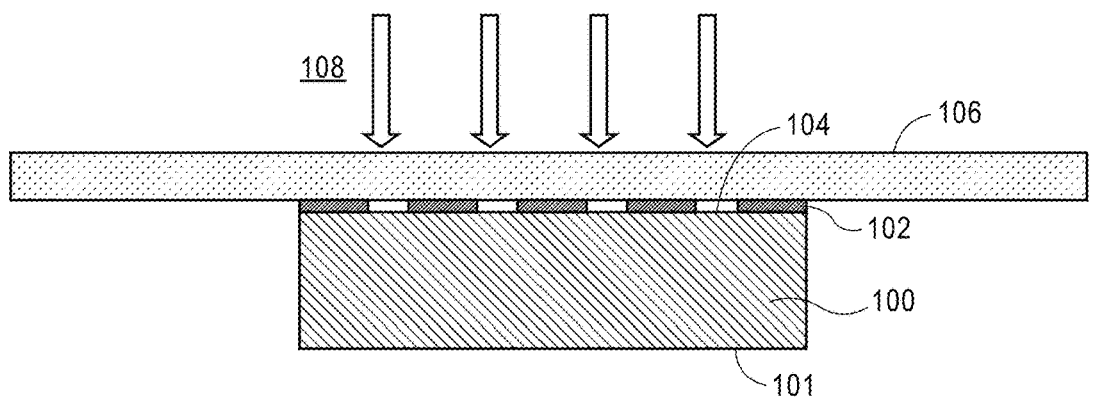

Referring to FIG. 2C, the metal foil 106 can be exposed to a laser beam 108 in locations over the openings 104 in the intervening layer 102 exposing portions of the semiconductor regions in or above the substrate 100. In an embodiment, the metal foil 106 is exposed to a laser beam 108 in locations at least partially over the openings 104 in the intervening layer 102. In some embodiments, the metal foil 106 is exposed to a laser beam 108 in locations offset, e.g., partially over or not over, the openings 104 in the intervening layer 102. In an example, the metal foil 106 is exposed to a laser beam 108 in locations adjacent to the openings 104.

Figure 2D:
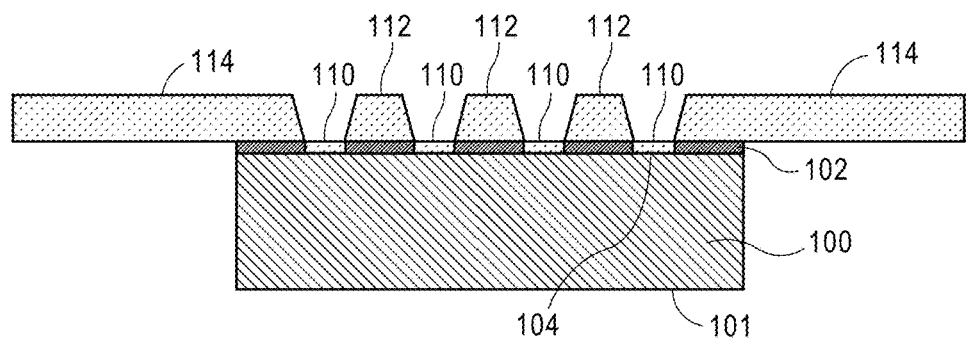

Referring to FIG. 2D, exposing the metal foil 106 to the laser beam 108 forms a plurality of conductive contact structures 110 electrically connected to the semiconductor regions in or above the substrate 100.

In accordance with one or more embodiments of the present disclosure, each conductive contact structure 110 is or includes a locally deposited metal portion. In one such embodiment, metal foil 106 acts as source or metal and is referred to as a local source since the metal foil 106 is first placed on a substrate surface. The metal foil 106 is then exposed to a laser process, e.g., exposure to a laser beam, that deposits metal from the metal foil 106 (metal source) onto portions of the substrate. It is to be appreciated that the resulting locally deposited metal portions can have an edge feature which can be distinguished from metal structure formed by other deposition processes such as plating, welding, or thermal bonding which can provide conformal structures absent an edge feature.

Referring again to FIG. 2D, second portions or portions 112 and 114 of the metal foil 106 not exposed to the laser beam 108 are retained on the intervening layer 102. The portions 112 are central portions, while the portions 114 are edge portions and can be overhang portions, as is depicted. In certain implementations, such second portions are not deposited or secured to the solar cell or the intervening layer 102. In an embodiment, the structure of FIG. 2D is implemented as a solar cell without removal of portions 112 and/or 114 of the metal foil 106. In a particular such embodiment, the overhang of edge portions 114 can be used for coupling to another solar cell, see for example FIG. 18A.

FIGS. 3A-3E illustrate cross-sectional views of various operations in a method of removing excess metal, such as excess metal foil from a solar cell, in accordance with an embodiment of the present disclosure. In a first approach for removal of at least a portion of metal foil that is not connected to a semiconductor substrate, a carrier sheet (e.g., a metal foil or a polymer sheet) is placed or located on a surface of a solar cell. Metal can be locally deposited onto the silicon wafer in locations of the laser scribe or patterning process.

Figure 3A:
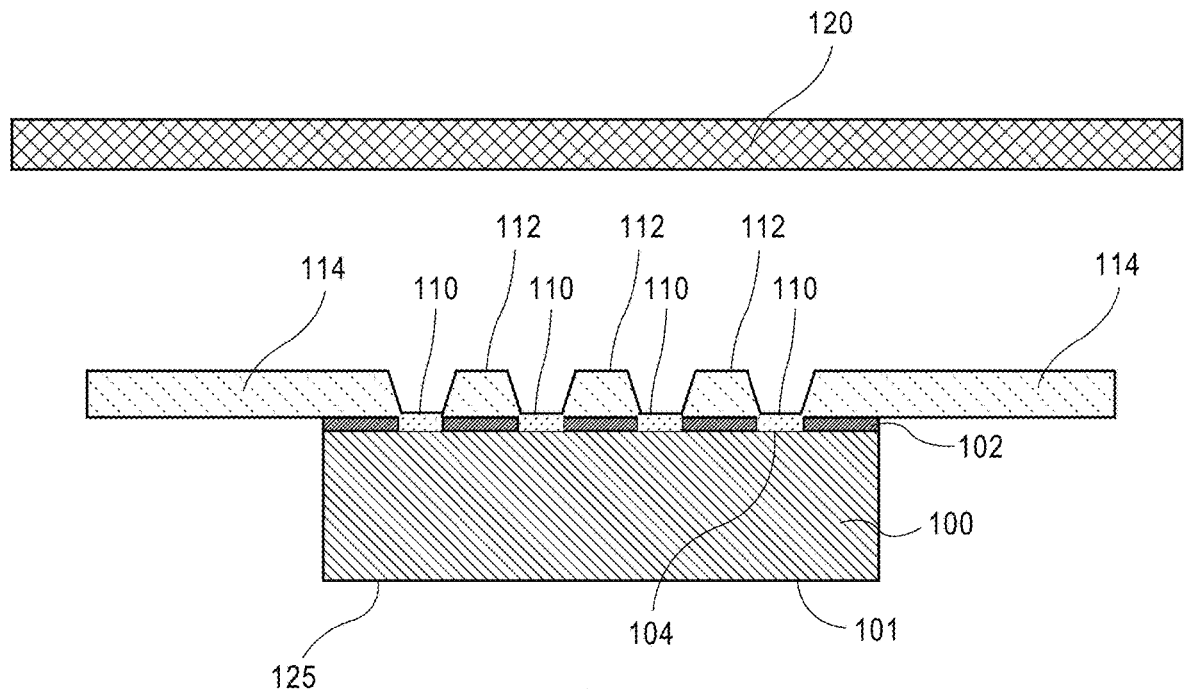
FIGS. 3A-3E illustrate cross-sectional views of various operations in a method of fabricating a solar cell.

Referring to FIG. 3A, a carrier sheet 120 can be provided to be placed, or fitted, over a solar cell 125 that can, in some embodiments, include an ARC layer or mask 102. In an embodiment, the ARC layer or mask 102 can include with contact openings 104 formed therein. In an embodiment, the solar cell 125 includes conductive contact structures 110 over the openings 104 in the anti-reflective coating layer 102. In addition to the locally deposited metal portions 110, the solar cell 125 includes metal foil portions 112 and/or 114 that need to be removed from the finished solar cell 125. Thus, in one embodiment, only metal portions 112 and 114 are removed, while portions 110 of the metal are retained. In an embodiment, as shown the locally deposited metal portions 110, metal foil portions 112, 114 can be located on a side of the solar cell 125. In one embodiment, the locally deposited metal portions 110, metal foil portions 112, 114 can be located on a front side or a back side of the solar cell 125. In some embodiments, the locally deposited metal portions 110, metal foil portions 112, 114 can be located on both the front and back side of the solar cell 125. In one such embodiment, the processes described herein can be performed on both the front side and/or back side of the solar cell, either on each side separately or in a single process.

Figure 3B:
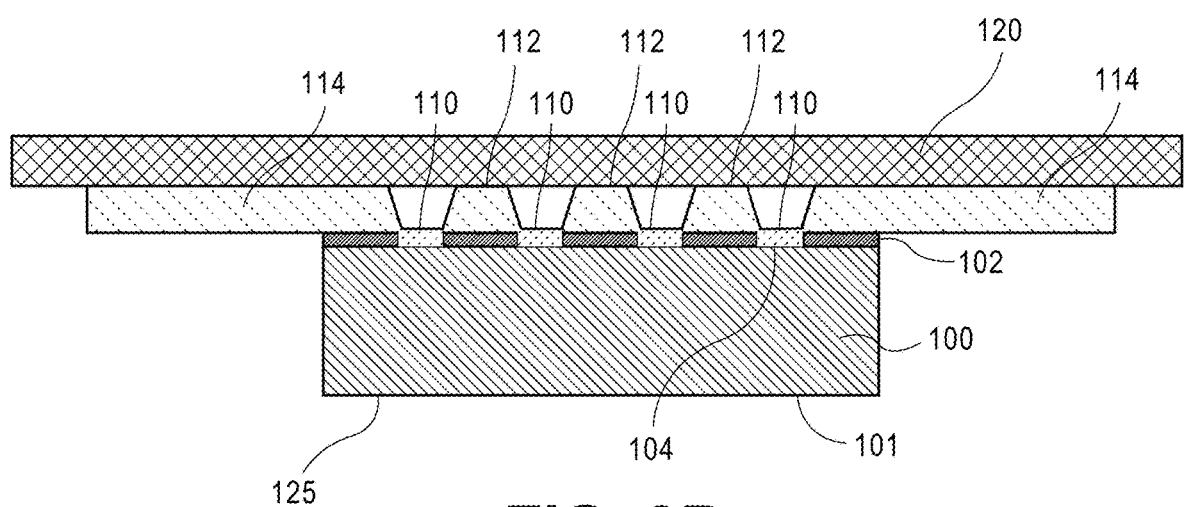

Turning to FIG. 3B, the carrier sheet 120 can be located over the solar cell 125 in contact with the metal portions 112 and 114 that need to be removed. In an example, the carrier sheet can be fit or mechanically held in place over the solar cell and metal portions 112, 114. In an example, a vacuum can be used to locate the solar carrier sheet 120 over the solar cell 125. In one example, an alignment system can be used to align the carrier sheet 120 to the solar cell 125 prior to locating the carrier sheet 120 over the solar cell 125.

Figure 3C:
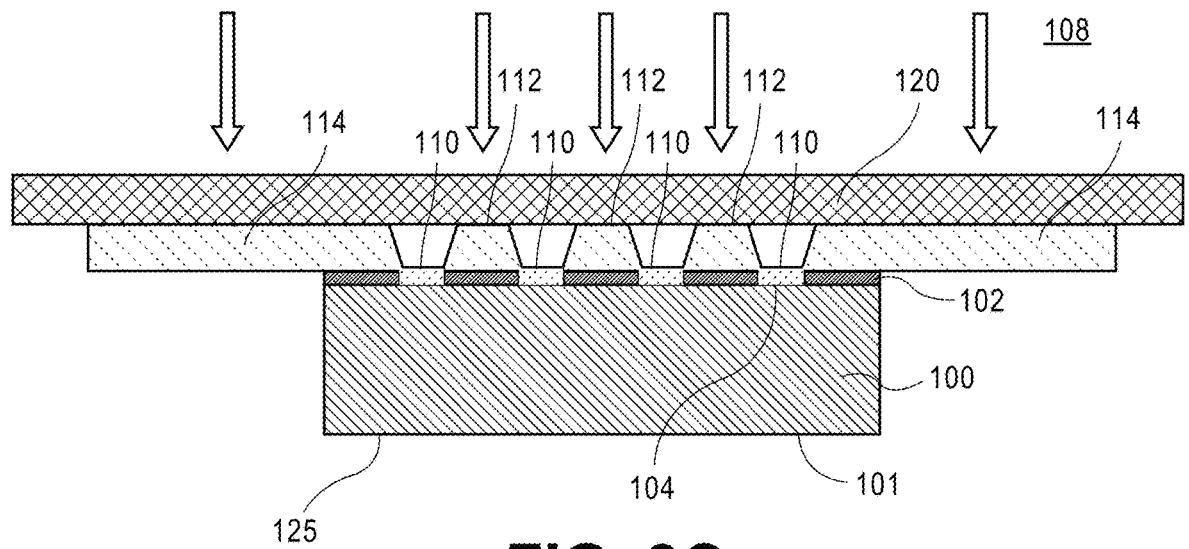
Figure 3D:
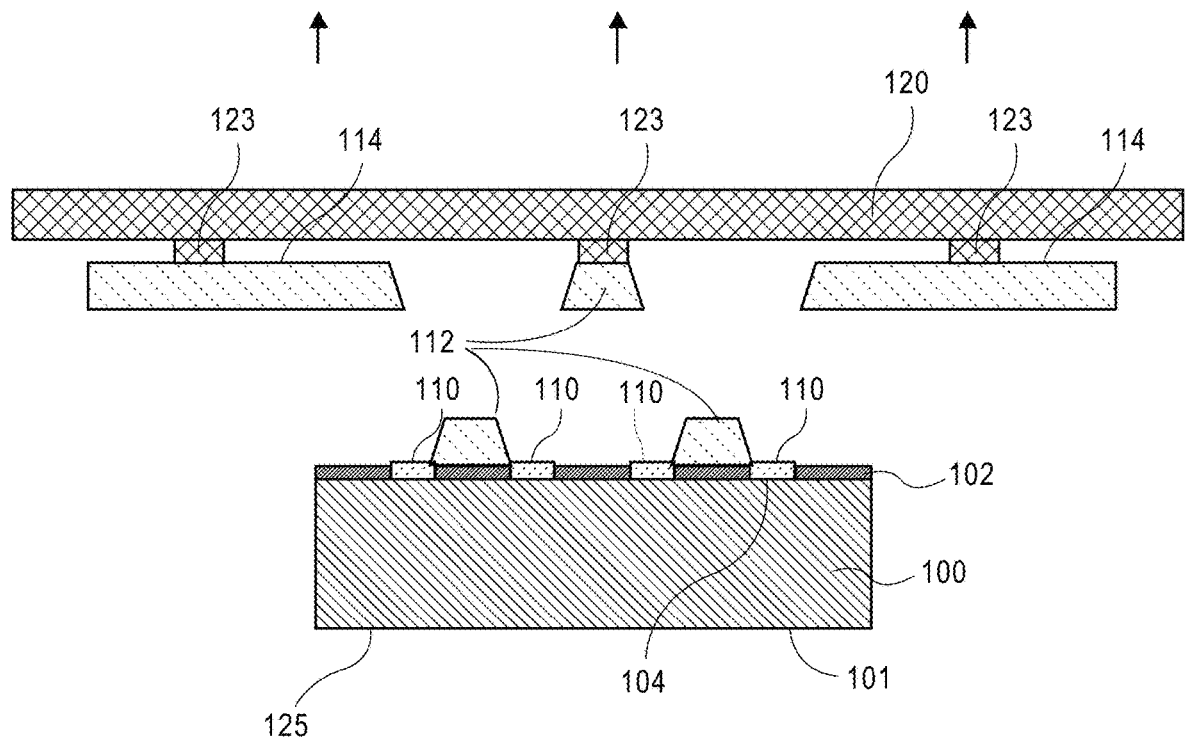
Figure 3E:
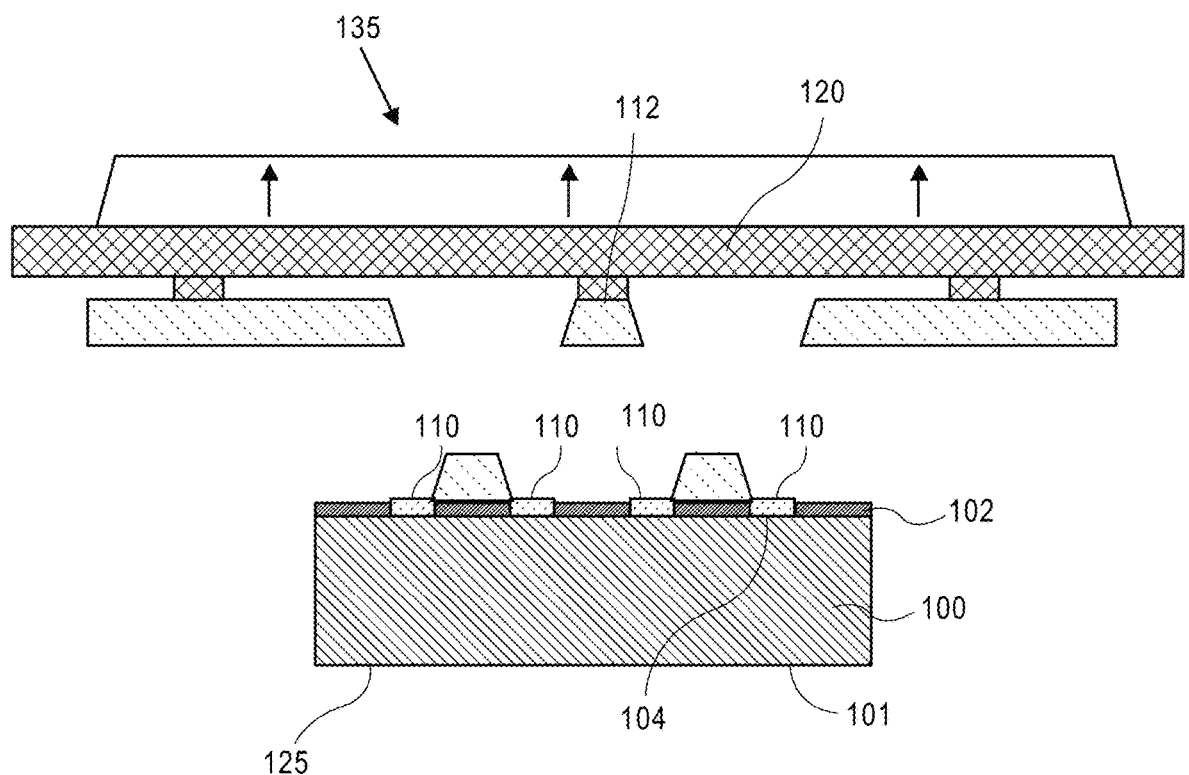

With reference to FIG. 3C-3E, the carrier sheet 120 can be subjected to laser patterning 108 over the regions of the carrier sheet 120 that correspond the metal portions 112 and 114. In an embodiment, subjecting the carrier sheet 120 to the laser beam 108 can form a plurality of connections 123, or bond regions, that couple the contact sheet to the metal portions 112 and 114. In an embodiment, subjecting the carrier sheet 120 to the laser beam 108 can include welding the carrier sheet 120 to the metal foil portions 112, 114. The metal foil exposed to another laser beam and/or exposed to a laser having different properties (e.g., power, frequency, etc.) can also be removed. In an embodiment, the connections 123 can include metal welds.

With reference to FIG. 3D the metal foil portions 112, 114 can be removed from the solar cell 125, in accordance with an embodiment of the present disclosure. In an embodiment, removing the metal foil portions 112, 114 can include removing or pulling off the carrier sheet 120 from the solar cell 125. In an example, removing or pulling the carrier sheet 120 in a direction away from the solar cell can include removing, for example in the direction of the arrows as shown in FIG. 3D, the portions 112 and 114 with the carrier sheet 120. In an embodiment, removing the metal foil portions 112, 114 by removing the carrier sheet 120 can include leaving the conductive contact structures 110 that can be confined to the solar cell 125. In an example, removing the metal foil portions 112, 114 by removing the carrier sheet 120 can include leaving the conductive contact structures 110 that are or located at openings 104 in the anti-reflective coating layer 102. In some examples, some of the metal foil portions 112 and/or can be left, e.g. not removed.

FIG. 3E illustrates a cross-sectional view of a solar cell showing a vacuum source 135 used to pull off metal foil portions 112 and 114 while leaving the conductive contact structures 110 on the surface of the semiconductor substrate 100, in accordance with an embodiment of the present disclosure. In an embodiment, using a vacuum can include using compressed air, suction, and/or any other similar vacuum process to remove the pull off the metal foil portions 112 and 114. Although a vacuum is shown, other apparatus or methods for removing the metal foil portion 112, 114 can be used. In some examples, some of the metal foil portions 112 and/or 114 can be left, e.g. not removed.

An approach to removing a carrier sheet includes attaching tabs to the end of the metal foil, and using these tabs to mechanically grab to remove the metal foil that has not been exposed to a laser beam to form conductive contact structures. With reference to FIG. 4A a semiconductor (not shown) and attached conductive contact structures 110. Residual metal foil 112 is removed by welding to tabs 123 with spot welds 127 to the metal foil 106, which is connected to 112. The tabs 123 are used pull the metal foil 106 up and away, leaving behind conductive contact structures 110. FIGS. 4B-4D are digital images showing the connection of metal tabs 123 to the edge of the metal foil 106 with spot welds 127 as used to remove excess metal from solar cells.

Figure 5:
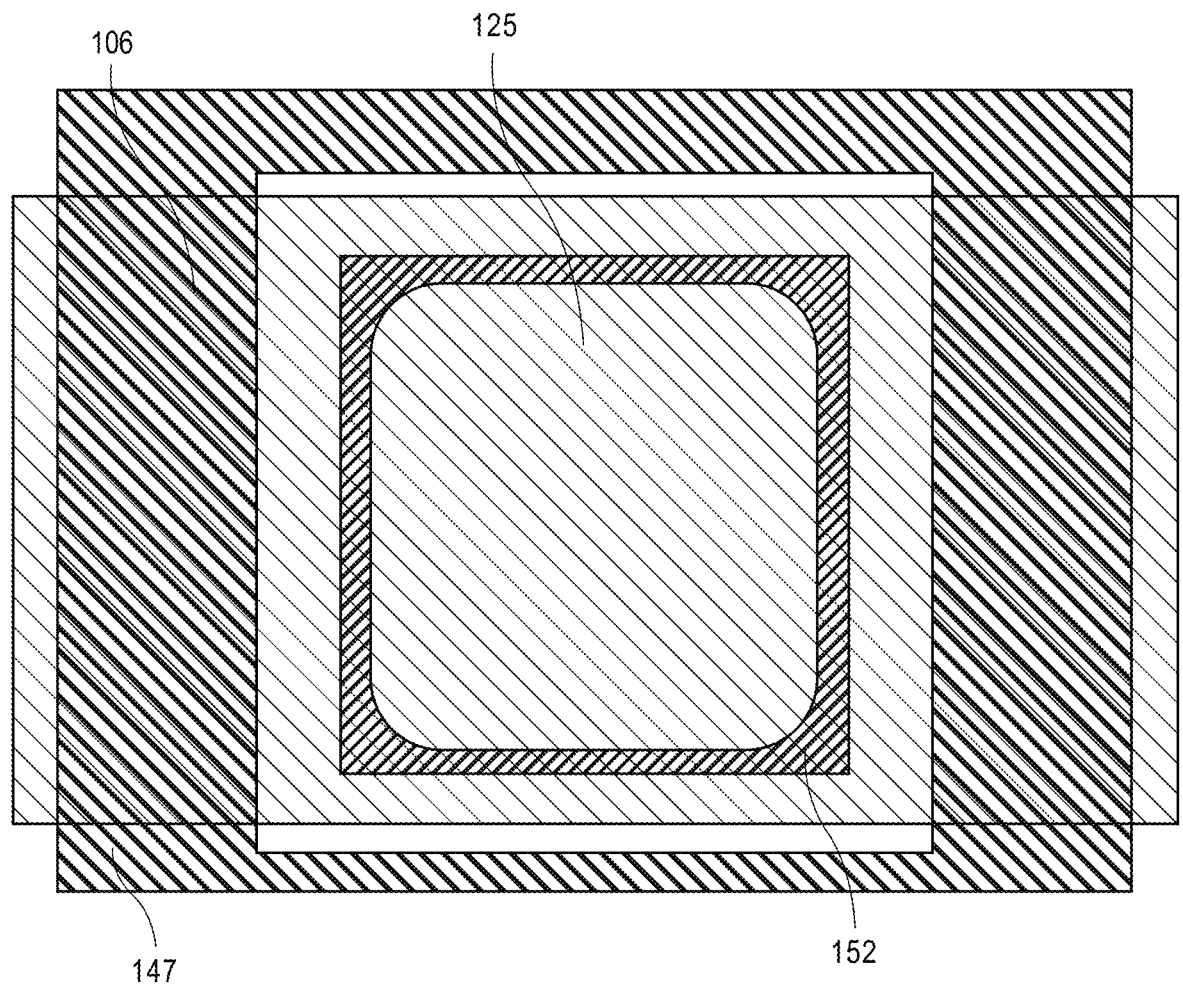
FIG. 5 illustrates a top view of a process of removing a metal foil from a solar cell.

Referring to FIG. 5, a solar cell 125 is held, for example in a chuck 152. A stage 147 can be used to raise a carrier sheet 120 such that air and/or water can be applied to remove the carrier sheet 120 from the solar cell 125 and any metal portions connected thereto.

Figure 6:
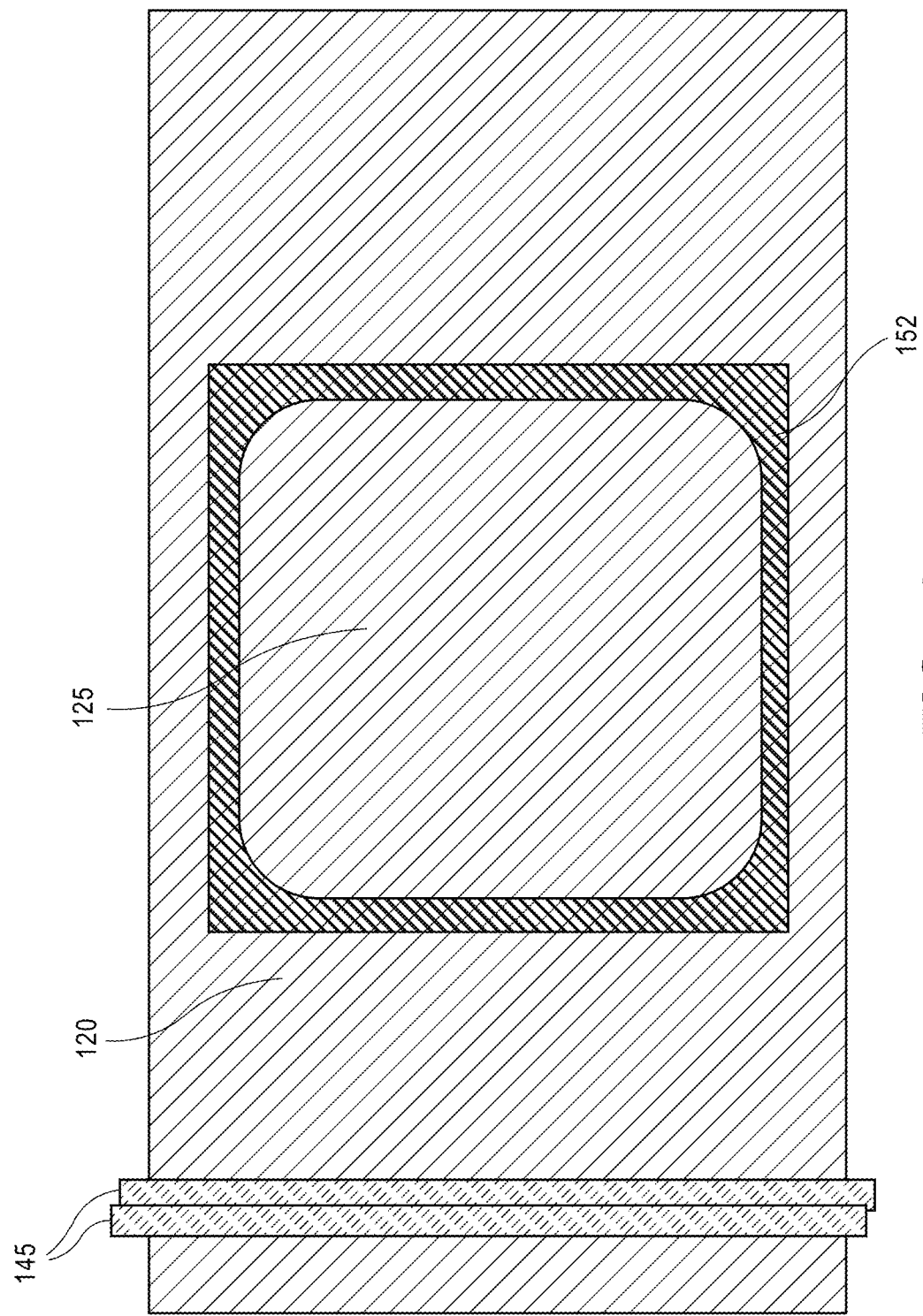
FIG. 6 illustrates a top view of a process of removing a metal foil from a solar cell.

FIG. 6 illustrates a top view of a process of removing a carrier sheet from a solar cell using a clamp, in accordance with an embodiment of the present disclosure. In another approach to removing a carrier sheet a clamp is used to grasp a portion of the carrier sheet extending beyond the solar cell to selectively remove the metal portions not in connected to the semiconductor substrate. Referring again to FIG. 6, a solar cell 125 is held, for example in a chuck 152. A clamp 145 can clamp a portion of a carrier sheet 120 extending beyond the solar cell 125 and can be used to lift the carrier sheet off 120 of the solar cell 125 and metal connected thereto.

Figure 7:
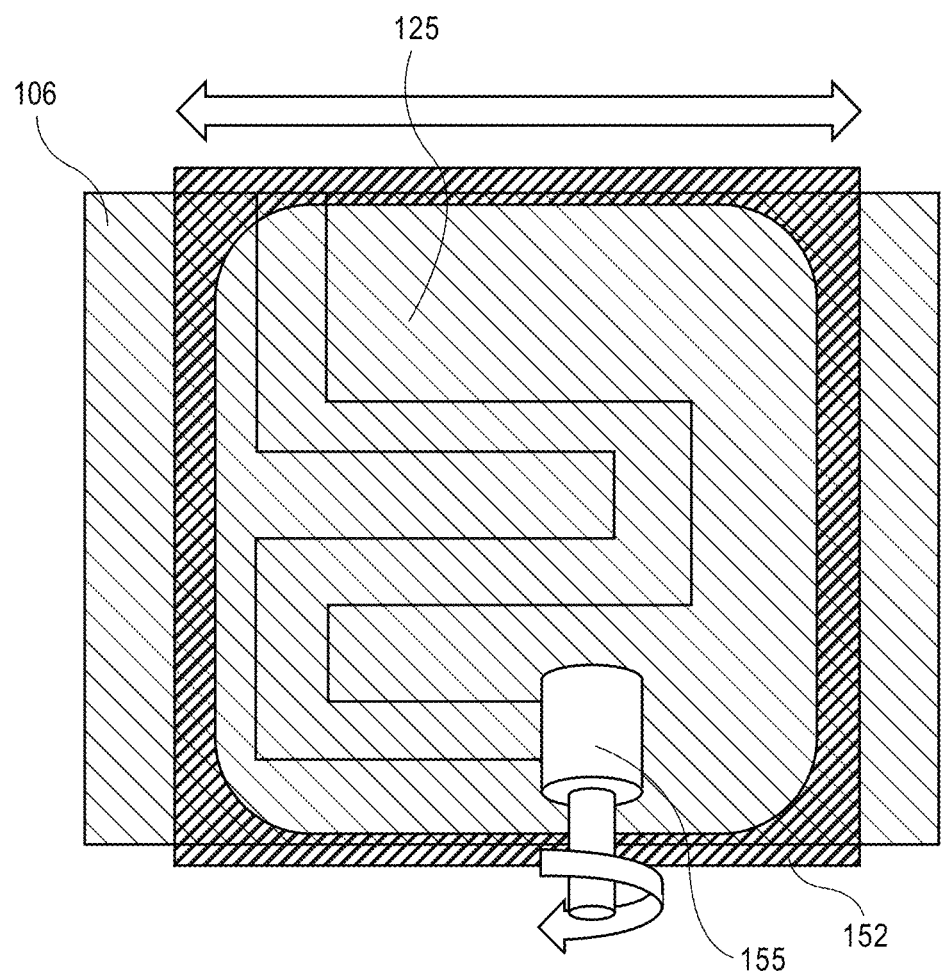
FIG. 7 illustrates a top view of a process of removing a metal foil from a solar cell.

FIG. 7 illustrates a top view of a process of removing a metal foil from a solar cell using a roller 155. The metal foil can be removed using a roller, such as a vacuum roller. In an example, using a roller or a vacuum roller can include selectively removing the metal portions of the metal foil not in connected to the semiconductor substrate. Referring again to FIG. 7, the solar cell 125 can be held, for example in a chuck 152. The roller 155 can be passed over the metal foil 106 to remove the metal connected.

Figure 8A:
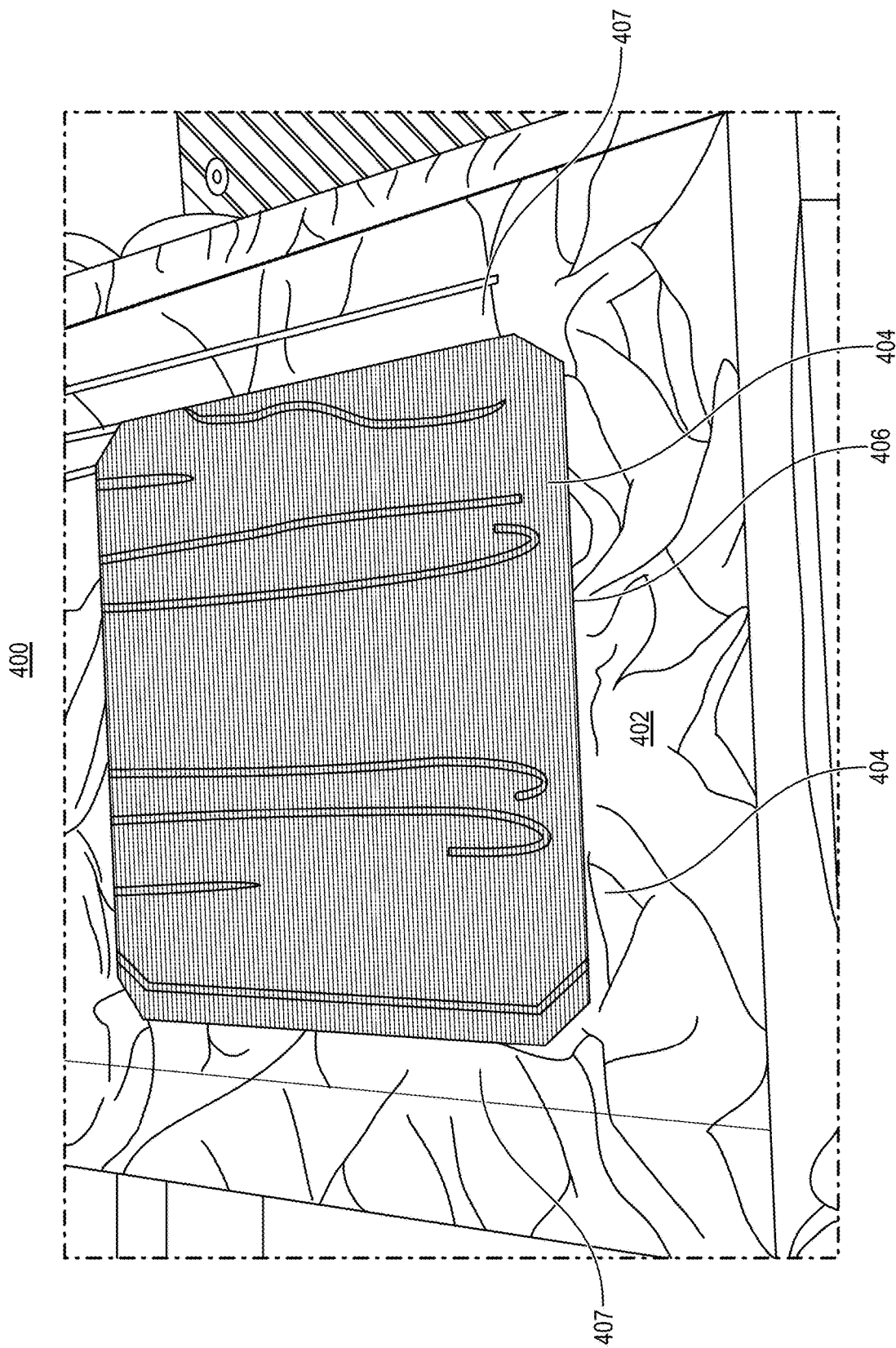
FIGS. 8A-8D include digital images of various operations in a method of fabricating a solar cell.
Figure 8B:
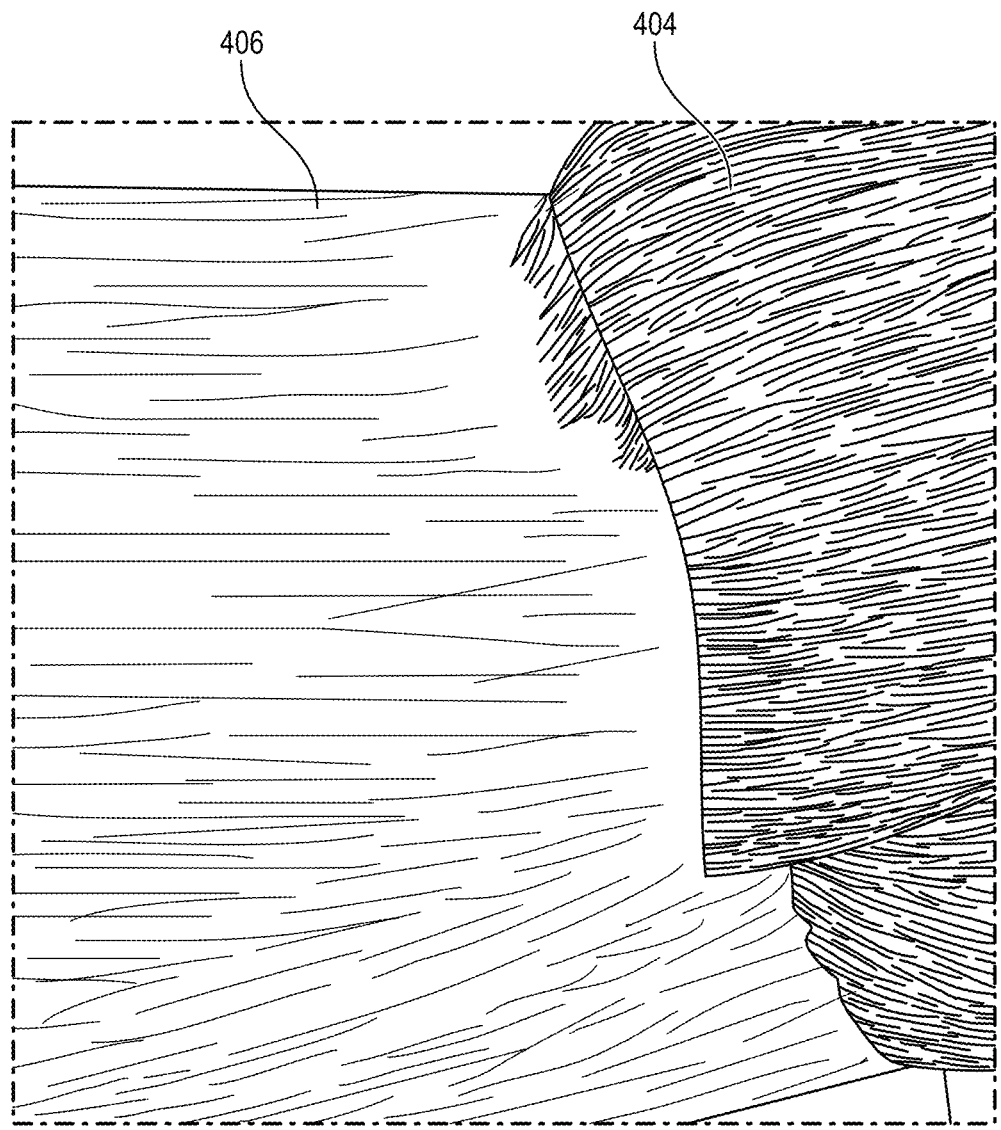
Figure 8C:
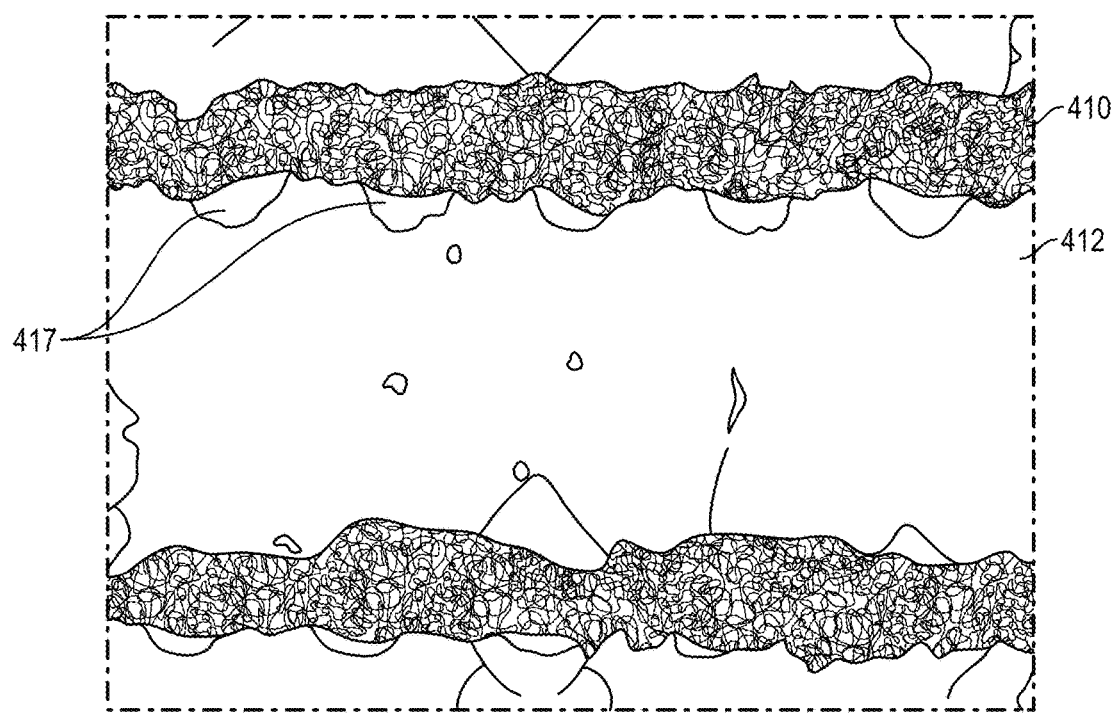
Figure 8D:
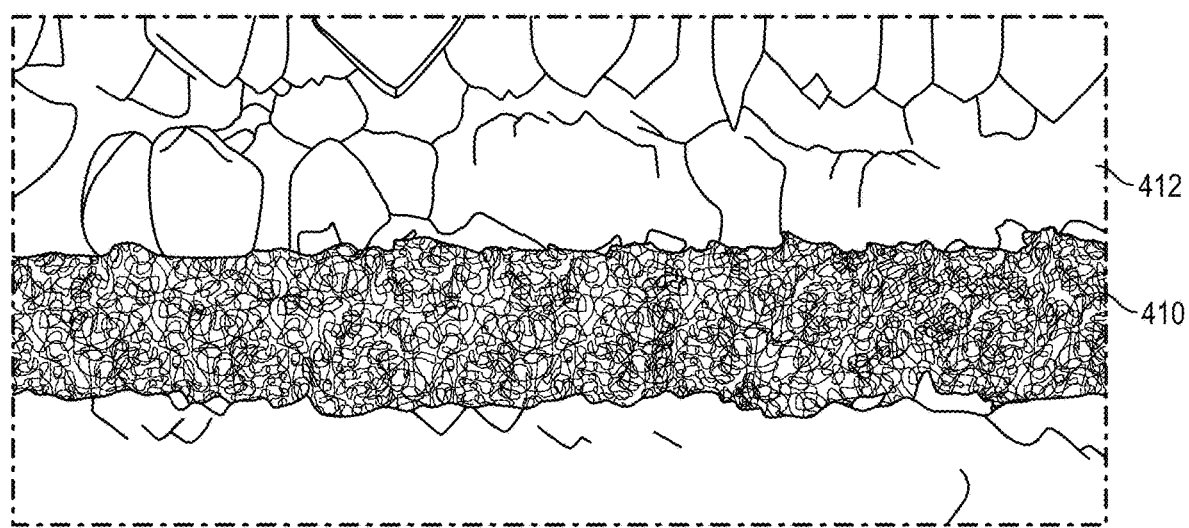

FIGS. 8A-8D include images of various operations in a method of fabricating a solar cell, in accordance with an embodiment of the present disclosure. Referring to FIG. 8A, a metal source (e.g., metal foil) can be placed or located on a surface of a silicon wafer and then laser can be used to pattern the metal foil. Metal can be locally deposited onto the silicon wafer in locations corresponding to the laser scribe or patterning process. Foil that is not laser scribed can be subsequently removed as shown in FIG. 8B. FIGS. 8C and 8D show magnified views of the locally deposited metal portions disposed over the substrate. FIGS. 8A-8D are described in more detail below. In accordance with an embodiment of the present disclosure.

Referring again to FIG. 8A, a plan view for a setup 400 to place or locate a metal foil 402 over a substrate 406 is shown, according to some embodiments. The setup 400 can include a metal foil 402 placed or fitted over a silicon substrate 406. Portions of the metal foil 402 over the substrate 406 are exposed to a laser beam in locations where openings in an intervening layer expose underlying emitter regions. Portions 404 of the metal foil 402 are not exposed to the laser beam. Portions 407 of the metal foil 402 can overhang the silicon substrate 406, as is depicted. In some embodiments, portions 404 can be exposed to another laser beam having different properties (e.g., power, frequency, etc.) at another step.

Referring again to FIG. 8B, portions 404 of the metal foil 402 are removed from substrate 406, e.g., by a peel off process. In an embodiment, excess portions 404 can be peeled off from the substrate 406. In an embodiment, the portions 404 can be portions of metal not exposed to a laser, as described in FIGS. 1A-8C above. In some embodiments, portions 404 can also be exposed to the laser beam or to another laser beam having different properties (e.g., power, frequency, etc.). In other embodiments, the metal foil can be removed by blowing (e.g., compressed air), jetting (e.g., using a high-pressure water jet process), applying an adhesive to the portions 404 and pulling of the adhered portions 404, or any other metal removal method.

Referring to FIGS. 8C and 8D, following removal of portions 404 from FIG. 8B, conductive contacts including metal 410 (e.g., aluminum) locally deposited by exposing the metal foil 402 to the laser beam can remain over openings in the intervening layer 412 of the substrate 406 of FIG. 8A and 8B. In an embodiment, the locally deposited metal 410 can be located over the intervening layer 412, where the intervening layer 412 can be disposed over the substrate 406 of FIGS. 8A and 8B. As shown, in an embodiment, the locally deposited metal 410 can be located in locations over, partially over, offset from and/or adjacent to the openings in the intervening layer 412. In an example, in FIG. 8C, locally deposited metal 410 can be partially over or offset from the contact openings in the intervening layer 412, for example exposing openings 417 in the intervening layer 412. In another example, in FIG. 8D, locally deposited metal 410 can aligned with and over the contact openings (not shown) the intervening layer 412.

Figure 9A:
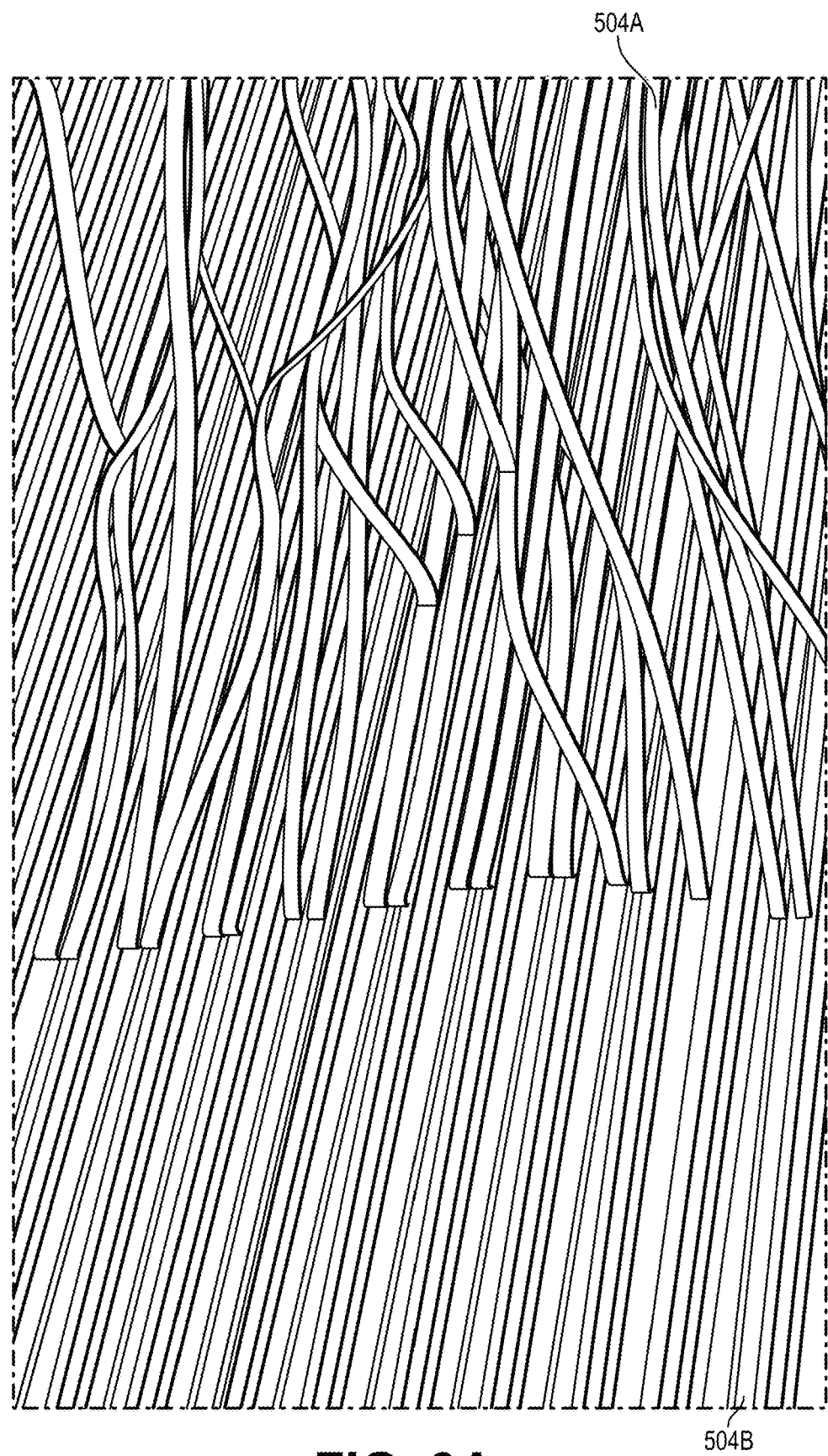
FIGS. 9A and 9B include digital images of various operations in a method of fabricating a solar cell.
Figure 9B:
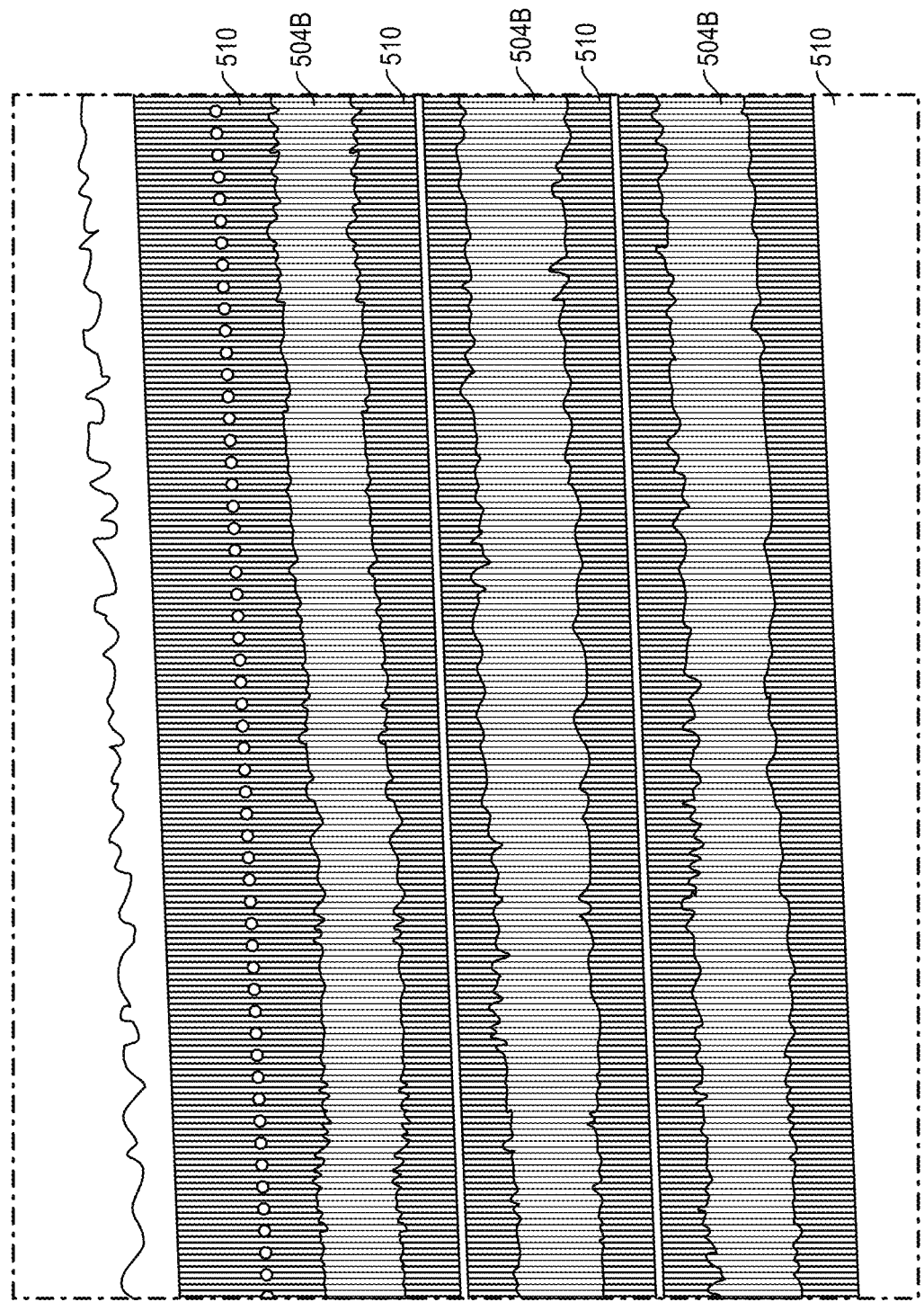

FIGS. 9A-9B are images of various operations in another method of fabricating a solar cell using a LAMP technique.

FIG. 9A illustrates a portion 504A of a metal foil removed from a substrate, where excess portions 504A are peeled off from the substrate.

FIG. 9B illustrates a solar cell structure following removal of the portions 504A of the metal foil 502 from FIG. 9A. Here, however, metal (e.g., aluminum) is locally deposited by a LAMP technique at 510 (for example conductive contact structures 110 in FIG. 2D) and portions 504B of the metal are not exposed to the laser beam but still remaining (for example as 112 in FIG. 2D). These portions 504B that are not exposed to a laser are not removed by a peel off process as per FIG. 9A. On the other hand, these portions 504B remain on the intervening layer between regions 510, where the metal has been removed. Subsequent processing can include exposing portions 504B to the laser beam or to another laser beam having different properties (e.g., power, frequency, etc.).

FIGS. 10A-10F illustrate side elevation views of various operations in a method of LAMP of substrates, in accordance with an embodiment of the present disclosure.

Figure 10A:
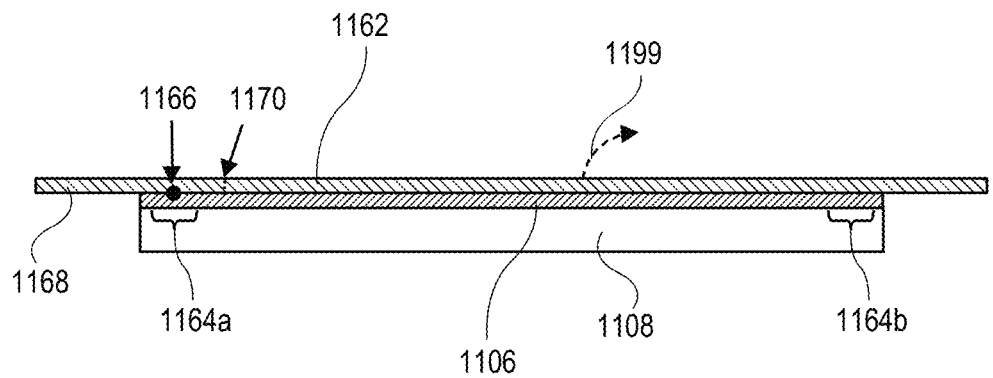
FIGS. 10A-10F illustrate side elevation views of various operations in a method of fabricating a solar cell.
Figure 10B:
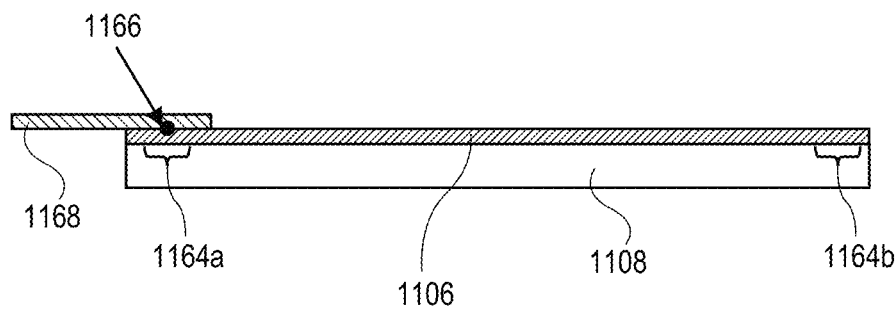

In an embodiment, as shown in FIG. 10A, a carrier 1162 is located over a substrate 1108 (e.g., a solar cell). In an example, the substrate include a metal foil 1106 having conductive contact structures including a locally deposited metal portion which is in electrical connection with the substrate 1108. The carrier 1162 can be attached to the metal foil 1106 at position 1166. Also shown are the locations of possible busbars 1164a and 1164b. The carrier 1162 can be scribed, such as laser scribed, at position 1170 so that portions of the carrier can be removed, see dashed arrow 1199, leaving behind an attached portion 1168 of carrier 1162. In an example, a smaller portion of carrier 1166 corresponding to the attached portion 1168 of carrier 1162 can be used, see FIG. 10B.

Figure 10C:
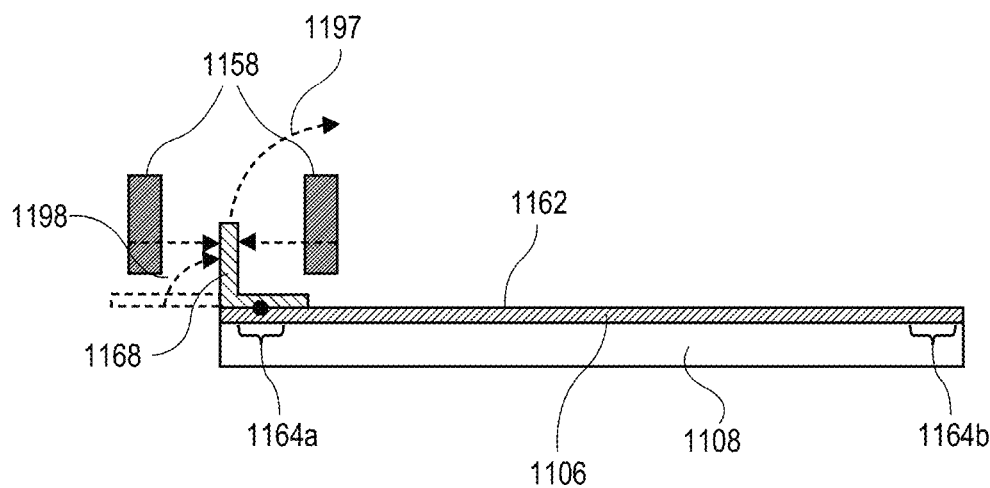

Turning to FIG. 10C, the attached portion of carrier 1168 can be bent as shown by arrow 1198 to position it to be grasped and/or retained by jaws 1158 of a clamp. In an example, the clamp can be configured to grasp the overhanding attached portion 1168 of carrier 1162. In an example, the bending can be in an angle between 0 and 90 degrees normal to the substrate, such as between 0 degrees and 30 degrees, 15 degrees and 45 degrees, 30 degrees and 60 degrees, 45 degrees and 75 degrees, or 60 degrees and 90 degrees. The bending angles described are applicable for the clamp process examples provided. The attached portion 1168 can be pulled away as shown by arrow 1197 to remove metal from the substrate 1108. Jaws 1158 may be textured, coated, or otherwise treated to increase the coefficient of friction.

Figure 10D:
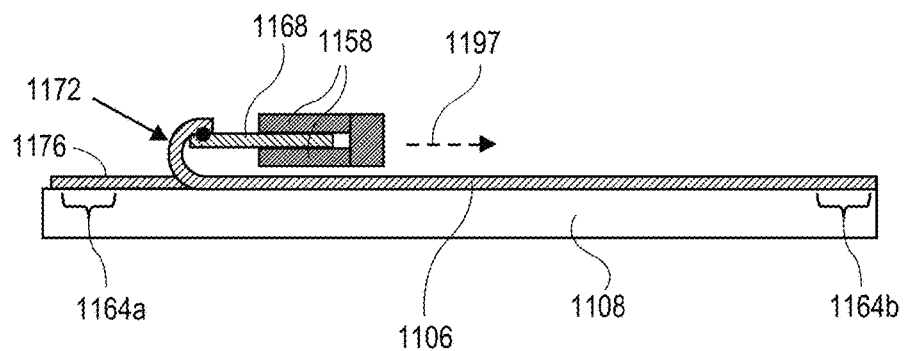
Figure 10E:
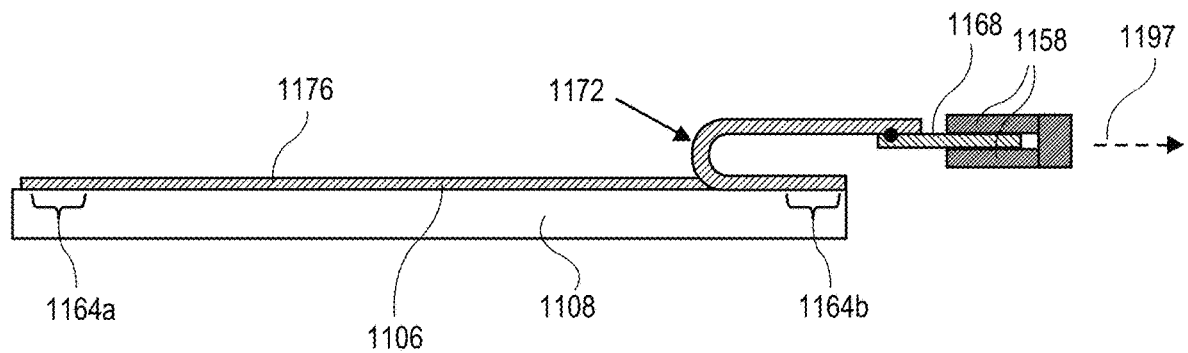
Figure 10F:
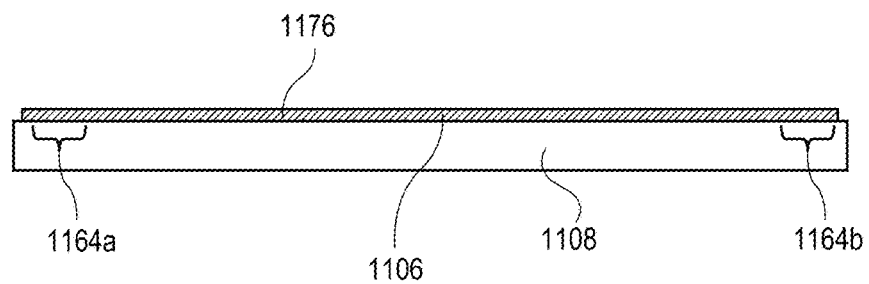

Turning to FIGS. 10D and 10E, once the attached portion 1168 of the carrier is securely grasped and/or retained by the clamp the attached portion 1168 of carrier 1162 and the attached metal foil 1106 can be pulled or drawn away from the substrate 1108. In an example, pulling away the attached metal foil can effectively remove foil 1172 while leaving behind the metal 1176 attached to the substrate 1108 with conductive contact structure including a locally deposited metal portion that is in electrical connection with the substrate 1108 to form the structure as shown in FIG. 10F.

FIGS. 11A-11F illustrate side elevation views of various operations in a method of LAMP of substrates, in accordance with an embodiment of the present disclosure. As distinguished from the embodiment shown in FIGS. 10A-10F two clamps can be used, for example to pull the portions of metal foil from two sub cells on a substrate.

Figure 11A:
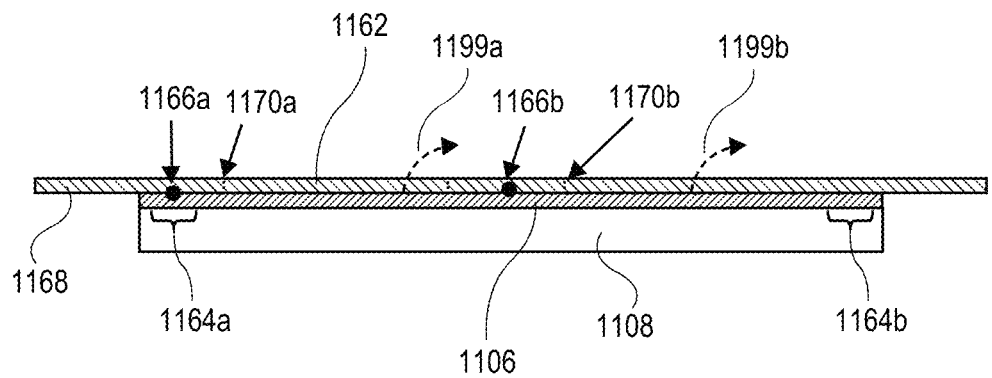
FIGS. 11A-11E illustrate side elevation views of various operations in a method of fabricating a solar cell.
Figure 11B:
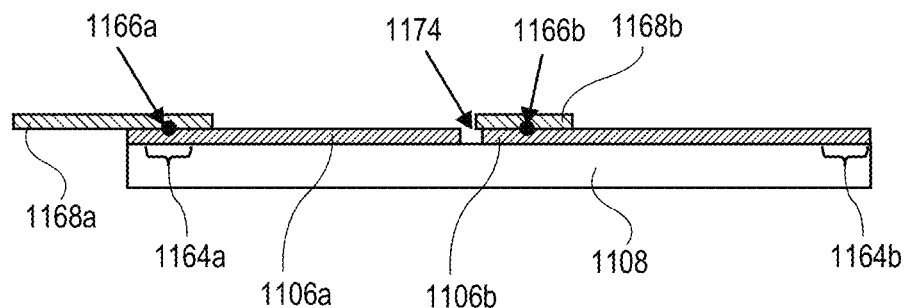

As shown in FIG. 11A a carrier 1162 can be located over a metal foil 1106 that has been attached to the substrate 1108 by a conductive contact structure including a locally deposited metal portion that is in electrical connection with the solar cell substrate 1108. In an example, the carrier 1162 is attached to the metal foil 1106 at positions 1166a and 1166b over two sub cells, respectively. Also shown are the locations of possible busbars 1164a and 1164b. The carrier can be scribed, such as laser scribed, at positions 1170a and 1170b so that portions of the carrier can be removed, see dashed arrow, leaving behind an attached portion 1168a and 1168b of carrier 1162. In an example, a smaller portion of carrier corresponding to the attached portion 1168a and 1168b of carrier 1162 can be used. The metal foil 1106 attached to the substrate 1108 can have conductive contact structures including a locally deposited metal portion that is in electrical connection with the substrate 1108. In an example, the substrate 1108 can be scribed, such as laser scribed, at position 1174 to divide the substrate 1108 into to two sub-cells, see FIG. 11B. The underlying substrate can also be scribed in the same or other operation.

Figure 11C:
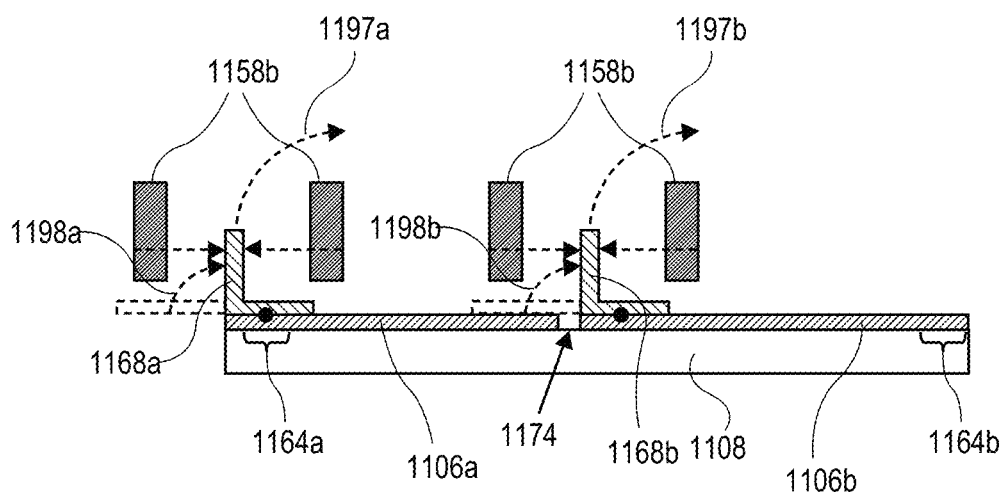

Turning to FIG. 11C, the attached portions 1168a and 1168b of carrier can be bent as shown by arrows 1198a and 1198b to position it to be grasped by clamp jaws 1158a and 1158b of two clamps. In an example, the clamp can be configured to grasp the overhanding attached portions 1168a and 1168b of carrier 1162. The attached portions 1168a and 1168b can be pulled away as shown by arrows 1197a and 1197b to remove metal from the substrate 1108.

Figure 11D:
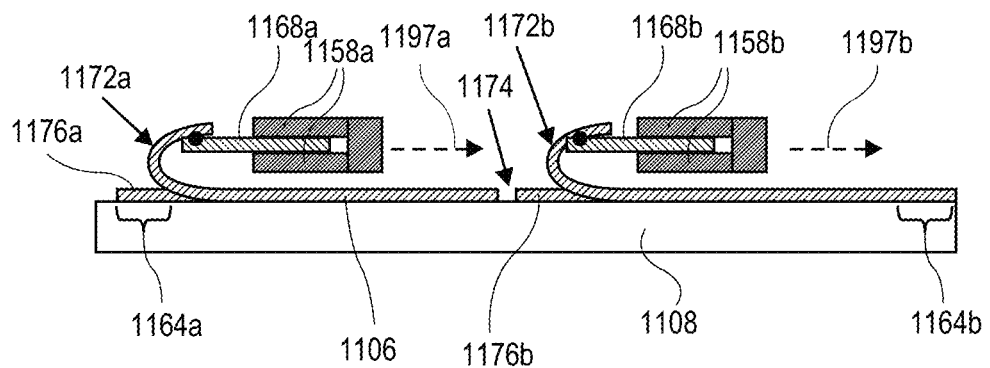
Figure 11E:
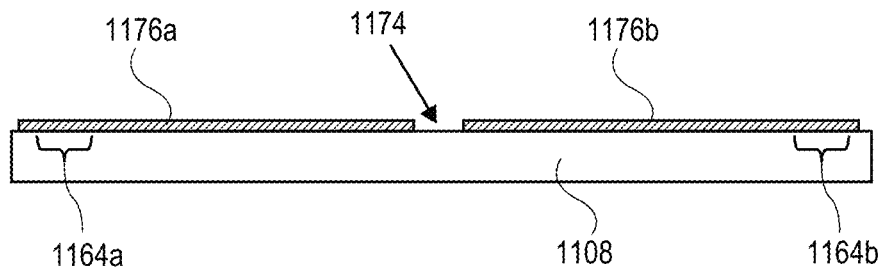

Turning to FIG. 11D, portions 1168a and 1168b of the carrier can be held or grasp of the jaws 1158a and 1158b the attached portions 1168a and 1168b of carrier 1162 and the attached foil can be pulled or drawn away from the solar cells substrate 1108. This effectively removes portions of the foil 1172a and 1172b while leaving behind the metal foil 1176a and 1176b that has been attached to the substrate 1108 conductive contact structure including a locally deposited metal portion that is in electrical connection with the substrate, see FIG. 11E.

FIGS. 12A-12E illustrate side elevation views of various operations in a method of LAMP of substrates, in accordance with an embodiment of the present disclosure. As distinguished from the embodiment shown in FIGS. 11A-

11E the two clamps used pull in opposite directions to pull the excess foil from two sub cells on a single solar cell substrate.

Figure 12A:
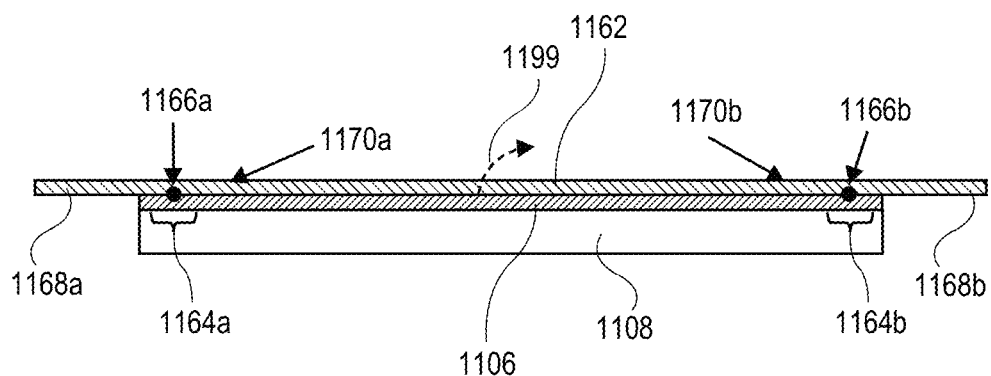
FIGS. 12A-12E illustrate side elevation views of various operations in a method of fabricating a solar cell.
Figure 12B:
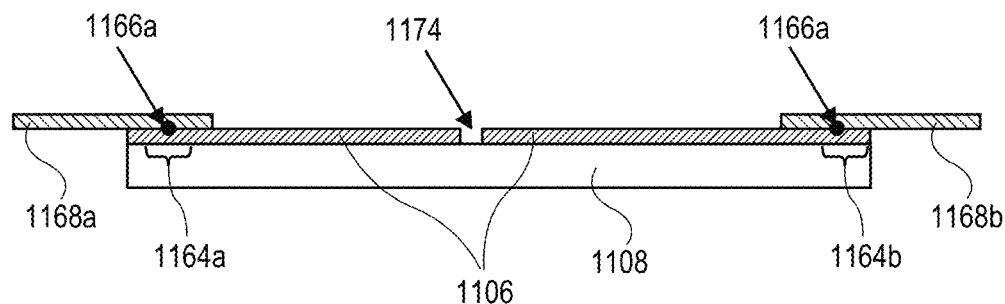

As shown in FIG. 12A a carrier 1162 is located over a substrate 1108 that includes a metal foil 1106 that has been attached to the solar cells substrate 1108 by a conductive contact structure including a locally deposited metal portion that is in electrical connection with the solar cell substrate 1108. The carrier 1162 is attached to the metal foil 1106 at positions 1166a and 1166b for the two sub cells respectively. Also shown are the locations of possible bus bars 1164a and 1164b. The carrier can be scribed, such as laser scribed, at positions 1170a and 1170b so that portions of the carrier can be removed, see dashed arrow, leaving behind an attached portion 1168a and 1168b of carrier 1162. In an example, a smaller portion of carrier corresponding to the attached portion 1168a and 1168b of carrier 1162 can be used. The metal foil 1176 that has been attached to the solar cell substrate 1108 conductive contact structure including a locally deposited metal portion that is in electrical connection with the solar cell substrate 1108 can be scribed, such as laser scribed, at position 1174 to divide the two sub cells, see FIG. 12B.

Figure 12C:
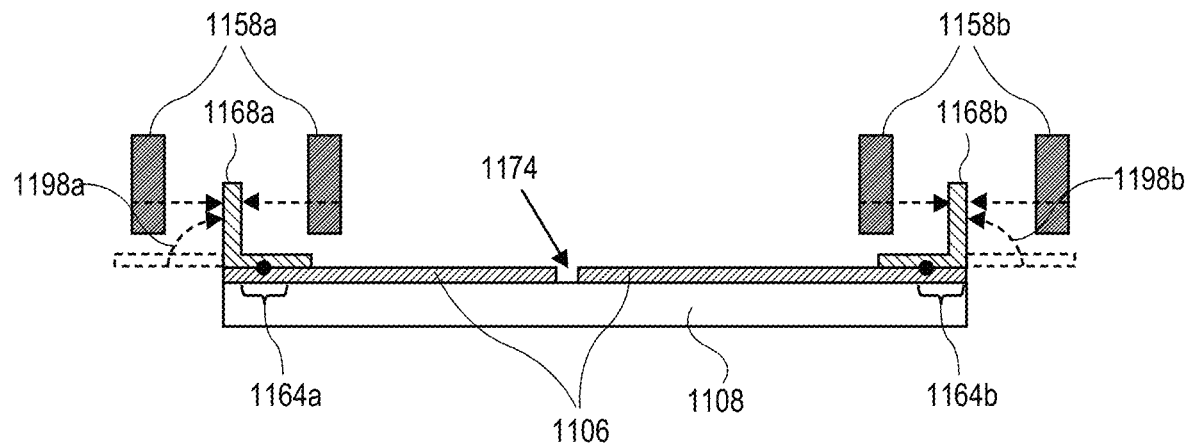

Turning to FIG. 12C, the attached portions 1168a and 1168b of carrier can be bent as shown to position it to be grasped by clamp jaws 1158a and 1158b of two clamps. Alternatively the clamp can be configured to grasp the overhanding attached portions 1168a and 1168b of carrier 1162. The attached portions 1168a and 1168b can be pulled away as shown by arrows 1197a and 1197b to remove metal from the substrate 1108.

Figure 12D:
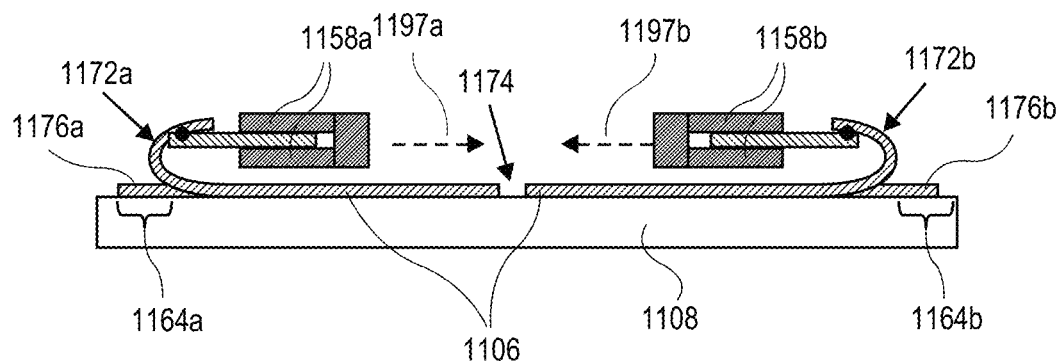
Figure 12E:
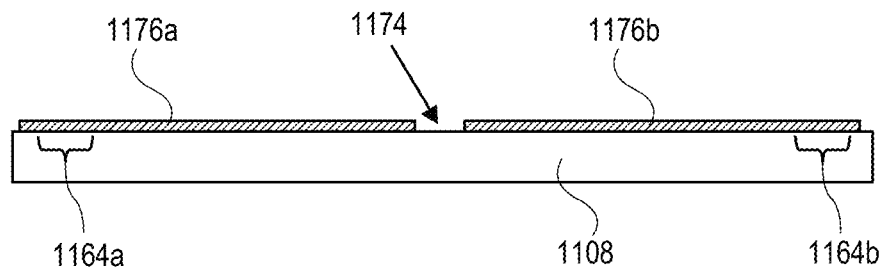

Turning to FIG. 12D once the attached portions 1168a and 1168b of the carrier are in the grasp of the jaws 1158a and 1158b the attached portions 1168a and 1168b of carrier 1162 and the attached foil can be pulled or drawn away from the solar cells substrate 1108. This effectively removes excess foil 1172a and 1172b while leaving behind the metal foil 1176a and 1176b that has been attached to the solar cell substrate 1108 conductive contact structure including a locally deposited metal portion that is in electrical connection with the substrate, see FIG. 12E.

Turning to FIGS. 13A-13C, in an embodiment, a mandrel 1751 can be included in the metal removal unit. Referring to 13A, the mandrel 1751 can collect the carrier and/or metal foil portions 1757 to be removed, where the carrier and/or metal foil 1757 can be located over a substrate 1759. Referring to 13B, the mandrel can be expanded 1753, rotated 1765 and translated 1763 (e.g., from one end of the substrate 1759 to another end as shown). Referring to 13C, the mandrel 1751 can be retracted to remove the carrier and/or metal foil portions 1757 from the substrate 1759.

Figure 14A:
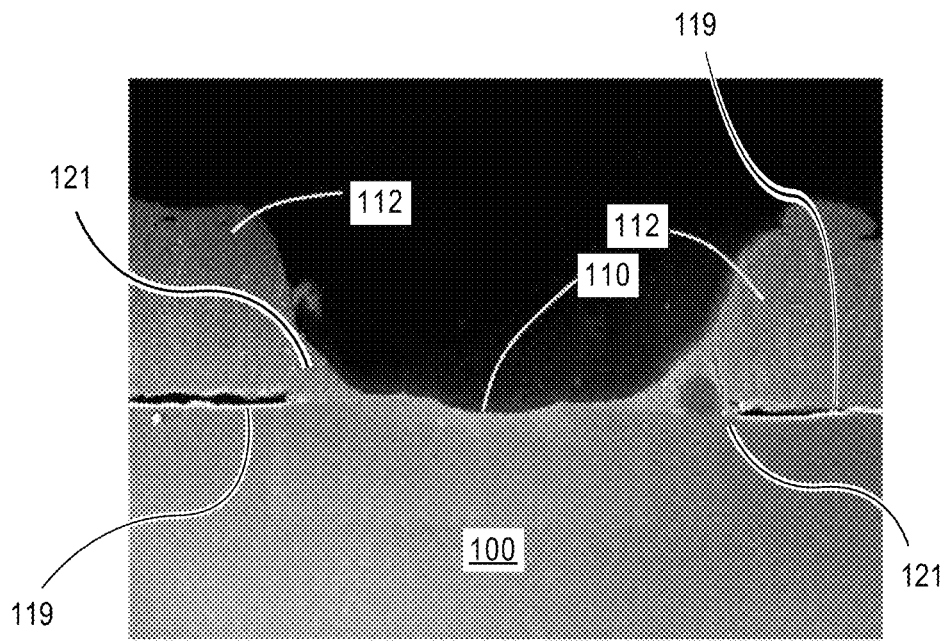
FIGS. 14A and 14B include digital images of cross-sectional views of a solar cell.
Figure 14B:
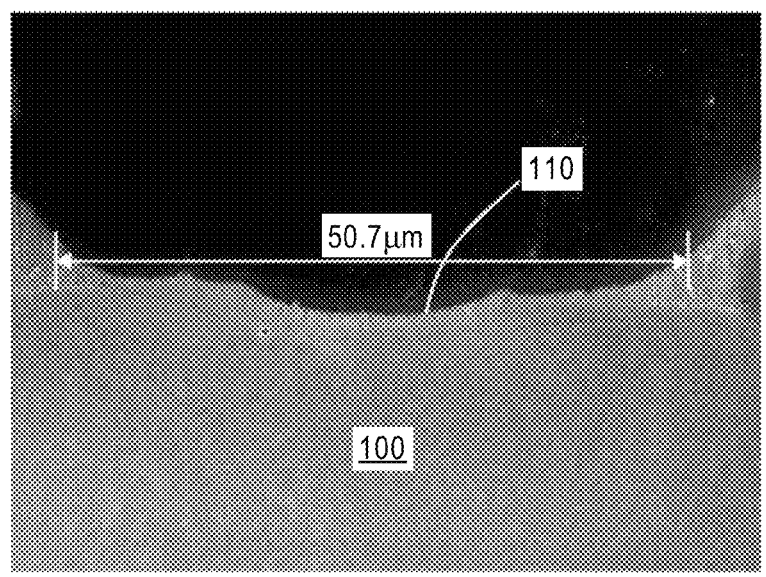

An exemplary structure is depicted in FIGS. 14A and 14B, where FIGS. 14A and 14B include digital images of cross-sectional views of a solar cell, in accordance with an embodiment of the present disclosure. Referring to FIG. 14A, exposing the metal foil to the laser beam forms a plurality of conductive contact structures 110 or "locally deposited" metal portions, electrically connected to the substrate, which can include a plurality of N-type and/or P-type semiconductor regions in or above the substrate 100. On either side of the conductive contact structures 110 are the second portions or portions 112 of the metal foil, which may or may not have been exposed to the laser beam. These portions 112 can be retained on the intervening layer intervening layers above substrate. The portions 112 are central portions as depicted in FIGS. 2A-3E. The conductive contact structures 110 can be connected, at least temporarily, until the removal of portions 112, leaving edge portions 121. Furthermore, as portions 112 may not be directly connected at the bottom to the substrate 100, a gap 119 is apparent between the portions 112 and the substrate 100, which is overlain with an intervening layer (intervening layer 104 as depicted in FIGS. 2A-3E). As can be seen in this view and FIG. 14B, which is a magnification of FIG. 14A, the resulting conductive contact structures 110 or locally deposited metal portions can have an edge feature, such as a sharp or torn edge feature when the second portions or portions 112 are removed, leaving behind at least a portion on the edge portion 121. Such an edge feature can be distinguished from metal structure formed by other metal deposition processes such as by a plating process which can provide conformal structures absent an edge feature.

Figure 15A:
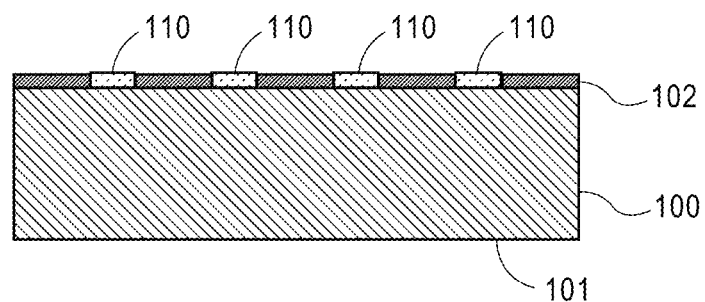
FIGS. 15A-15D illustrate cross-sectional views of a solar cell.
Figure 15B:
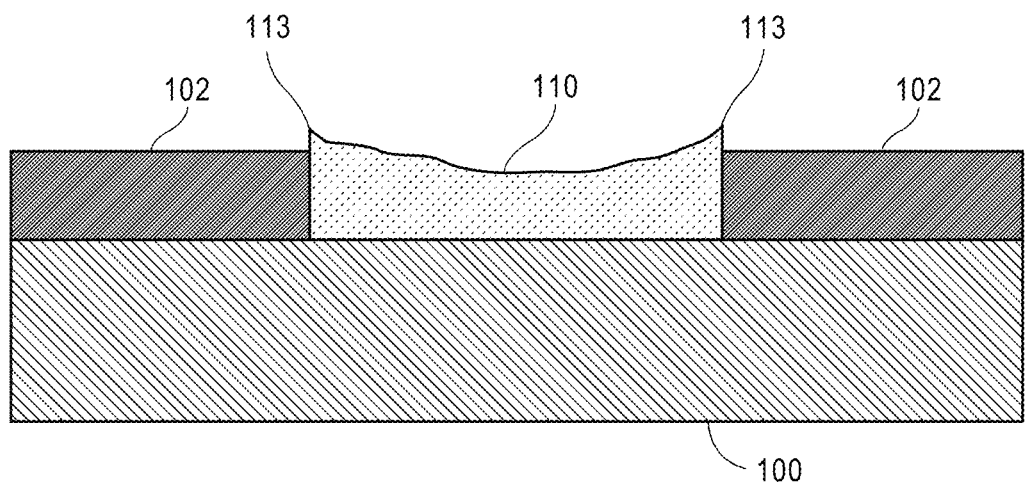

FIGS. 15A-15D illustrate cross-sectional views of a solar cell. As shown in FIG. 15A, removal of the second portions of the metal foil can leave behind the conductive contact structures 110 on the locations in the intervening layer 102 that have exposed portions of the plurality of N-type and/or P-type semiconductor regions in or above the substrate 100. In FIG. 15B, the formation of sharp or torn edge features 113 on either side of the conductive contact structures 110 is shown. These edge features 113, as described above, are formed from the removal the second portions of the metal foil not exposed to the laser beam. In an embodiment, exposing the metal foil 106 to the laser beam 108 includes removing all or substantially all portions of the metal foil not exposed to the laser beam.

Figure 15C:
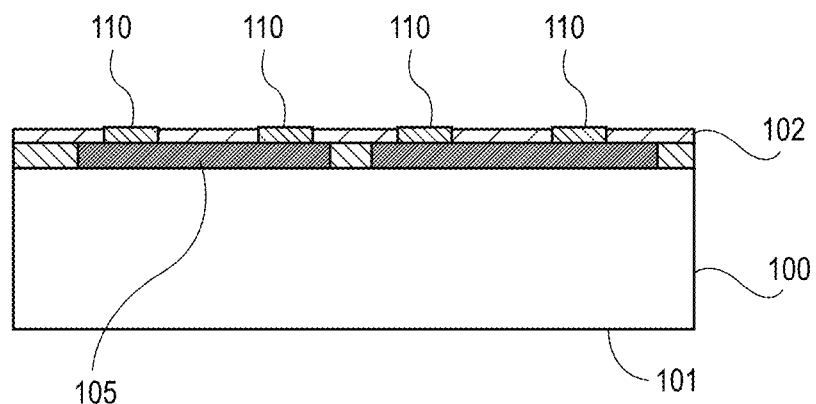

FIG. 15C shows the position of N-type and/or P-type semiconductor regions 105. In the embodiment shown, N-type and/or P-type semiconductor regions 105 are separated from one another, and each semiconductor region has two conductive contact structures 110. Alternatives, not shown, include one, three or more conductive contact structures per semiconductor region. In an example, the N-type and/or P-type semiconductor regions can have trenches formed there between, the trenches extending partially into the substrate, and covered by intervening layer 102. In one example, N-type and/or P-type semiconductor regions can be separated by an intrinsic or lightly doped region there between, e.g., where the lightly doped regions can have a doping concentration substantially less than the N-type and/or P-type semiconductor regions. In some embodiments, the semiconductor regions 105 can have the same conductivity type, are all N-type or P-type, as in some front contact solar cells. It is contemplated that the conductive contact structures 110 can be reinforced with a second metal source as described, as described above.

Figure 15D:
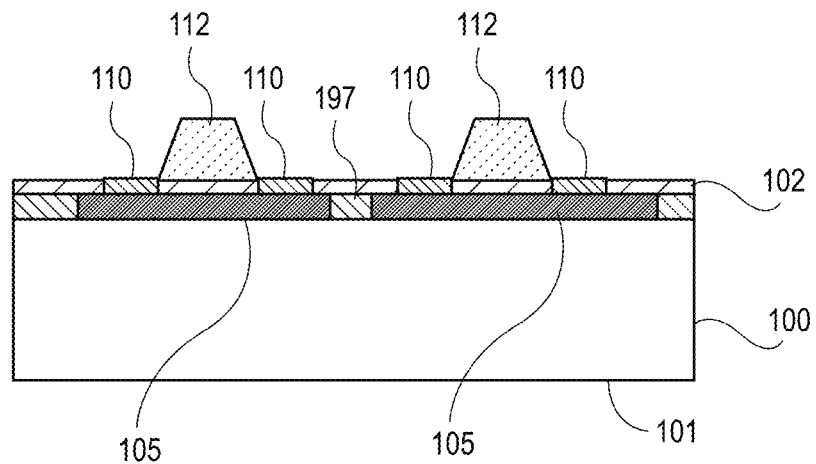

FIG. 15D illustrates a cross-sectional views of a solar cell. As shown in FIG. 15D, the laser forms the conductive contact structures 110 and portions 112 above the intervening layer 102, such as an ARC or BARC layer. Portions 114 have been removed. The position of N-type and/or P-type semiconductor regions 105. In one example, N-type and/or P-type semiconductor regions are separated, for example by a lightly doped region 197 there between, e.g., where the lightly doped regions can have a doping concentration substantially less than the N-type and/or P-type semiconductor regions. In some embodiments, the semiconductor regions 105 can have the same conductivity type, are all N-type or P-type, as in some front contact solar cells. It is contemplated that the conductive contact structures 110 can be reinforced with a second metal source as described, as described above. It is further contemplated that the portions 112 can be formed from a second metal source as described, as described above.

Figure 16:
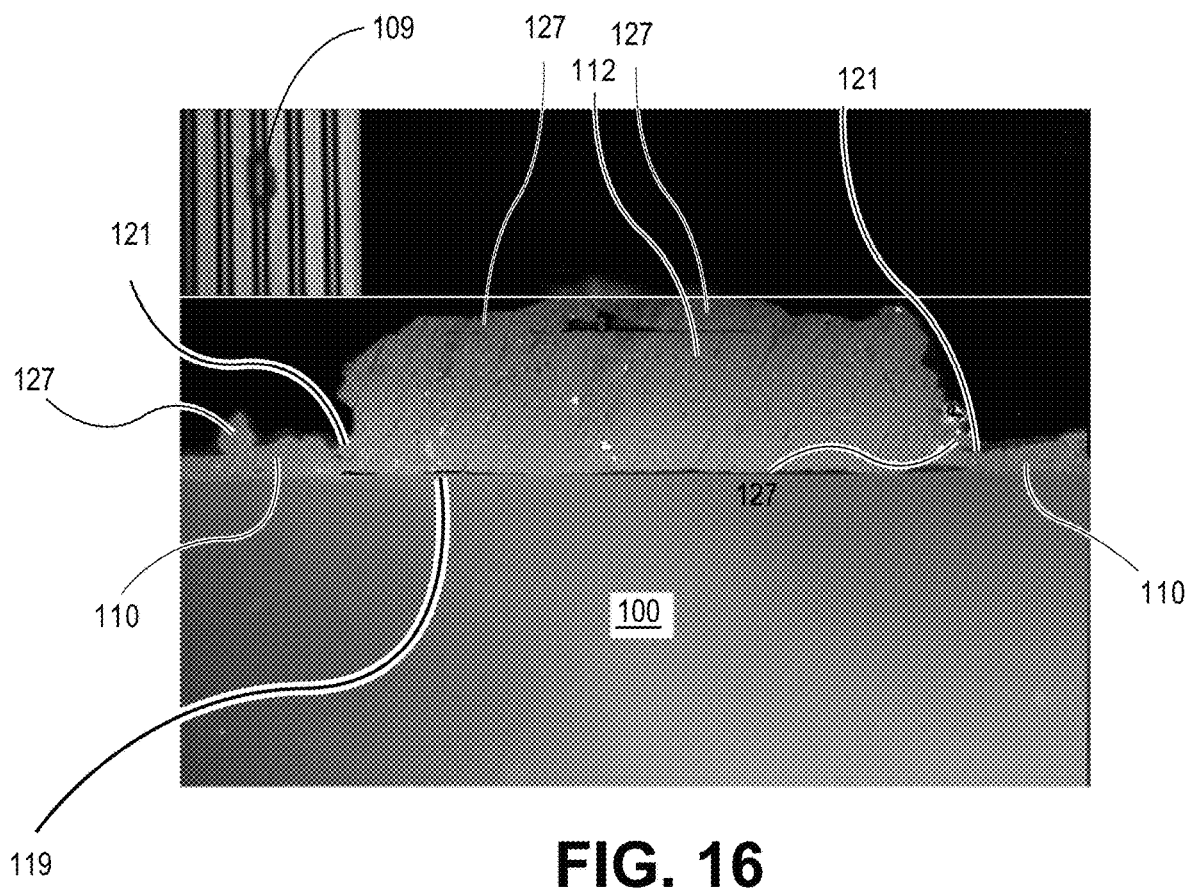
FIG. 16 includes a digital image of cross-sectional view of a solar cell.

FIG. 16 is a digital image of a cross-section of a solar cell subsequent to a LAMP technique. Inset 109 in the upper-left of the digital image shows the region of the solar cell, circled, where the cross-section was taken. In this example, portions 112 of the metal foil 106 are retained. These portions 112 are portions of the metal foil 106 not exposed to the laser beam or exposed to a laser beam having different properties (e.g., power, frequency, etc.). The portions 112 can also be exposed to a different laser beam at subsequent process step. Also, as shown in FIG. 16, the laser forms the conductive contact structures 110 which can be connected portion 112, where portion 112 is located above the substrate 100. In an embodiment, the portion 112 can carry current between conductive contact structures 110. In an embodiment, exposing the metal foil to the laser beam can form a spatter feature 127 on the solar cell. Such a spatter feature can be used to determine if the solar cell was formed using one or more of the laser assisted metallization processes disclosed herein, for example as differentiated from a welding or soldering process. Also, optionally, these spatter features on 112 can be removed by mechanical cleaning such as brush or chemical cleaning, a water jet process, high pressure air blowing process, and mechanically grab and peel can be used to remove the region 112 completely. FIG. 16 further shows a gap 119 that is apparent between the portion 112 and the substrate 100, which is overlain with an intervening layer (see intervening layer 104 as depicted in FIGS. 2A-2D). Also seen in this view is the edge portion 121.

Figure 17A:
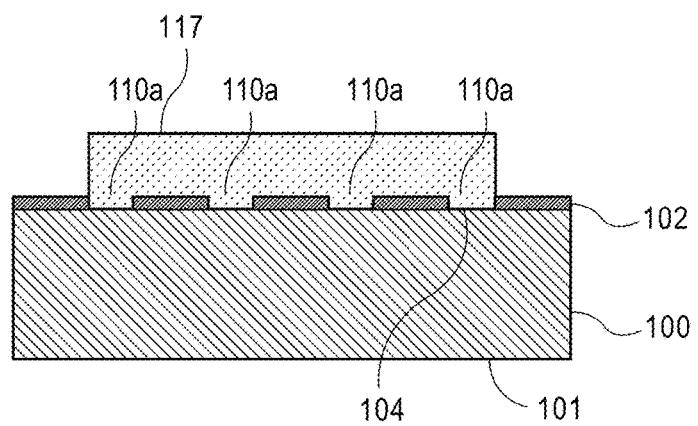
FIG. 17A illustrates a cross-sectional view of a solar cell.

FIGS. 17A-17D illustrate alternative implementations, in which a metal foil forms busbars that run transverse to the conductive contact structures and conduct current across the conductive contact structures. With reference to FIG. 17A, the busbar 117 runs transverse to the conductive contacts and makes contact with the conductive contacts 110a that contact the substrate 100 through openings 104 in intervening layer 102. As shown in the plan view of FIG. 17B, the openings 104 can be in pairs, as shown (e.g., referring to FIGS. 1G, 1H). As shown, the conductive contact structure 131a can be connected to the busbar 117 and the conductive 131b can be connected to an opposite polarity busbar (not shown). The fingers 131a and 131b also can include a portion 112 of the metal foil as shown for example in FIG. 5B. Generally speaking 131a, 131b can include any of the example metallization configurations presented herein. In an example, the metal deposition process can form an ohmic contact between the metal foil and the substrate. In an example, the ohmic contact can be formed between the busbar 117 and conductive contact structures 131a or 131b. It is contemplated that the busbar as described with respect to FIGS. 17A-17D can be formed from the metal foil and/or the second metal source, as described above.

Figure 17B:
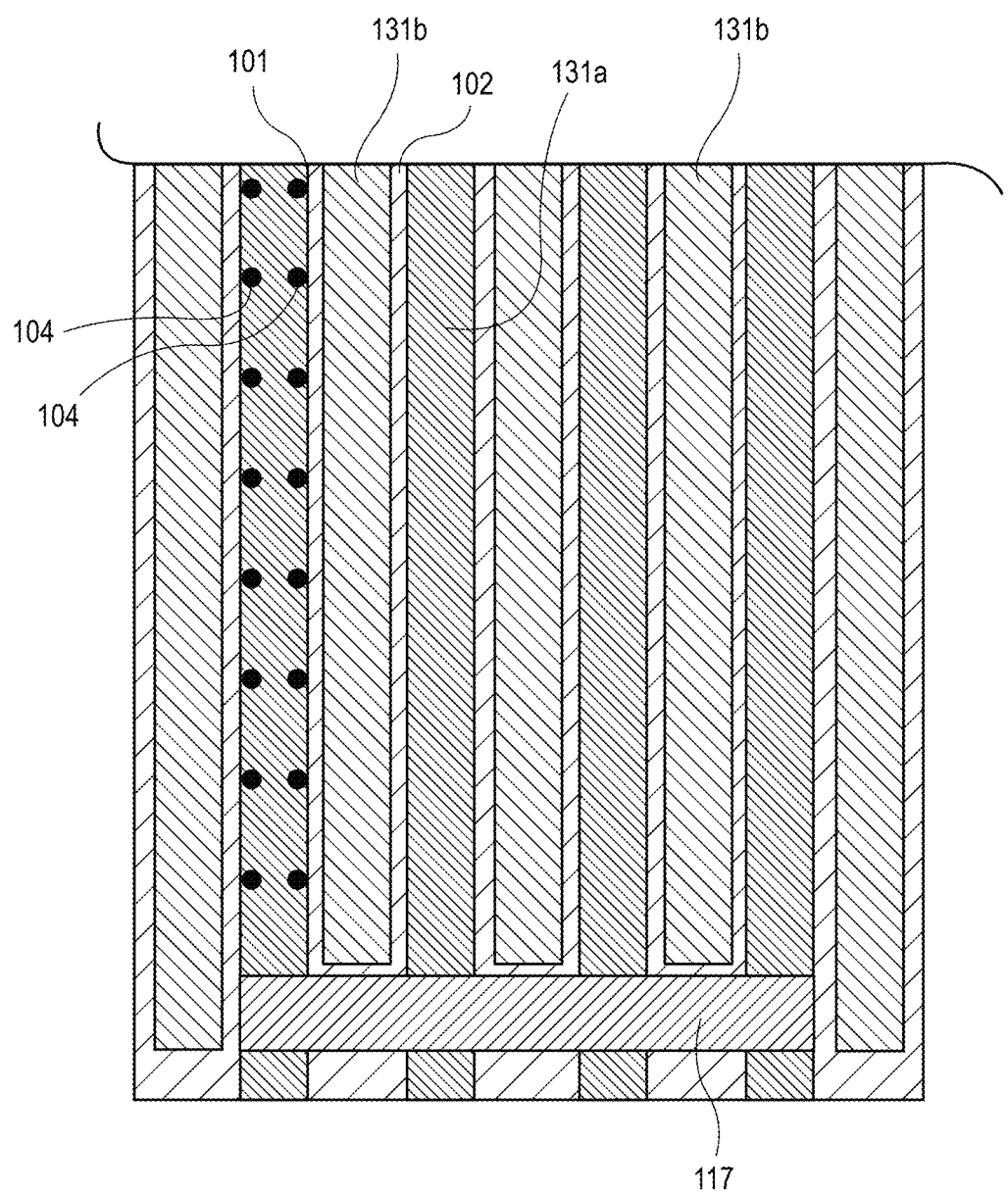
FIG. 17B illustrates a plan view of a solar cell.
Figure 17C:
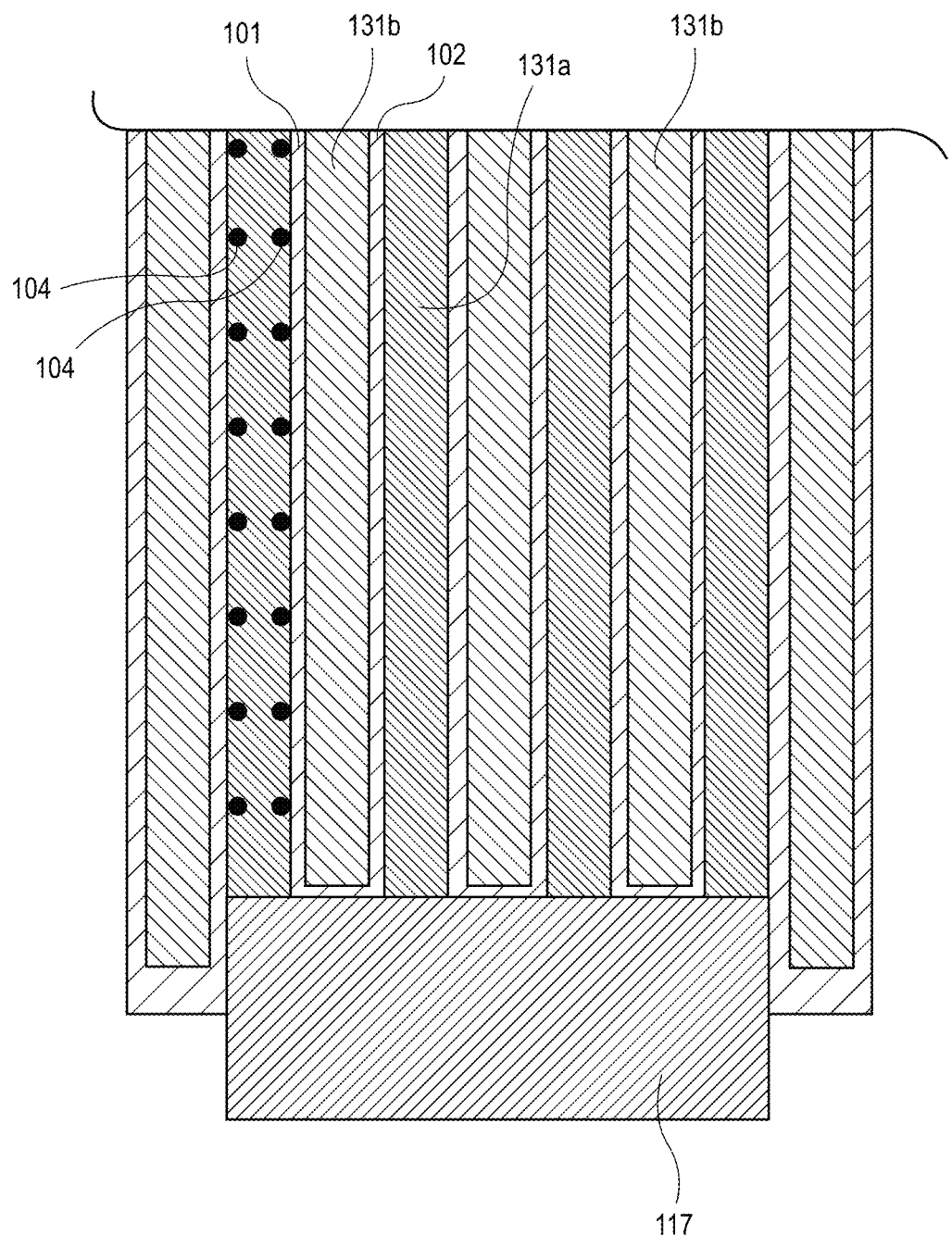
FIG. 17C illustrates a plan view of a solar cell.

With reference to FIG. 17C, the busbar 117 can have an interconnect portion to electrically connect the busbar 117 of one solar cell to a busbar of another solar cell (not shown). The fingers 131a and 131b can be a locally deposited region, such as described above for. See FIG. 4A. In an example, the metal deposition process can form an ohmic contact between the metal foil and the substrate. In an example, the ohmic contact can be formed between the busbar 117 and conductive contact structures 131a and/or 131b.

Figure 17D:
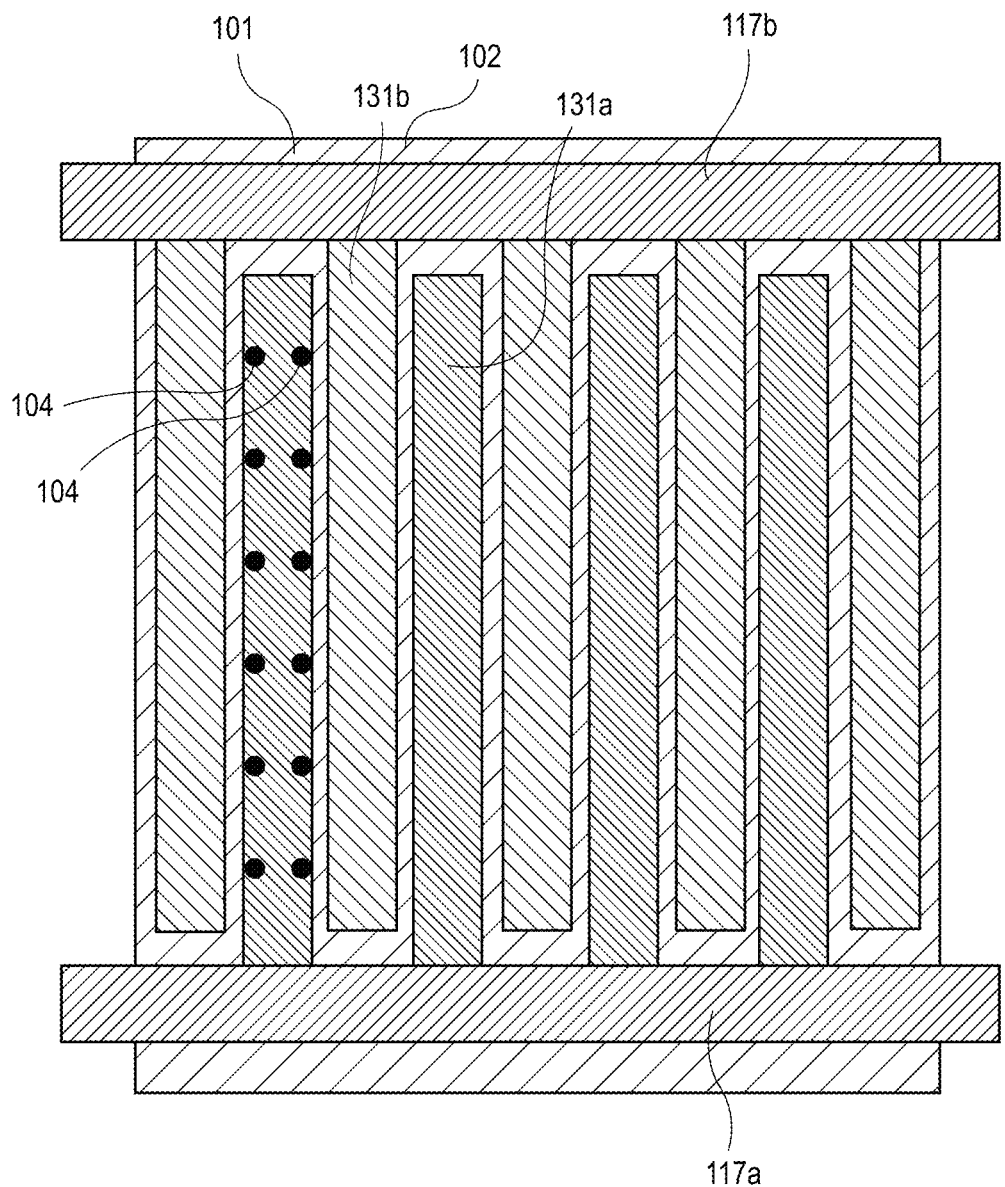
FIG. 17D illustrates a plan view of a solar cell.

Referring to FIG. 17D, in contrast to that shown in FIGS. 17A-17C, the busbar, in this case busbars 117a and 117b can optionally extend past the edges of substrate 100 as shown in FIG. 17D. In some examples, busbars can be formed on either end of the substrate 100, see, e.g. busbars 117a and 117b. In still other embodiment, a solar cell can have one or more busbars in the middle of the cell. The busbars 117a and 117b can carry current between conductive contact structures 131a, 131b, respectively. In an embodiment, the busbar 117a and 117b can carry current without creating large amount of resistance between conductive contacts 131a, 131b. In an example, the metal deposition process can form an ohmic contact between the metal foil and the substrate. In an example, the ohmic contact can be formed between the busbar 117a and 117b and conductive contact structures 131a and/or 131b.

Figure 18A:
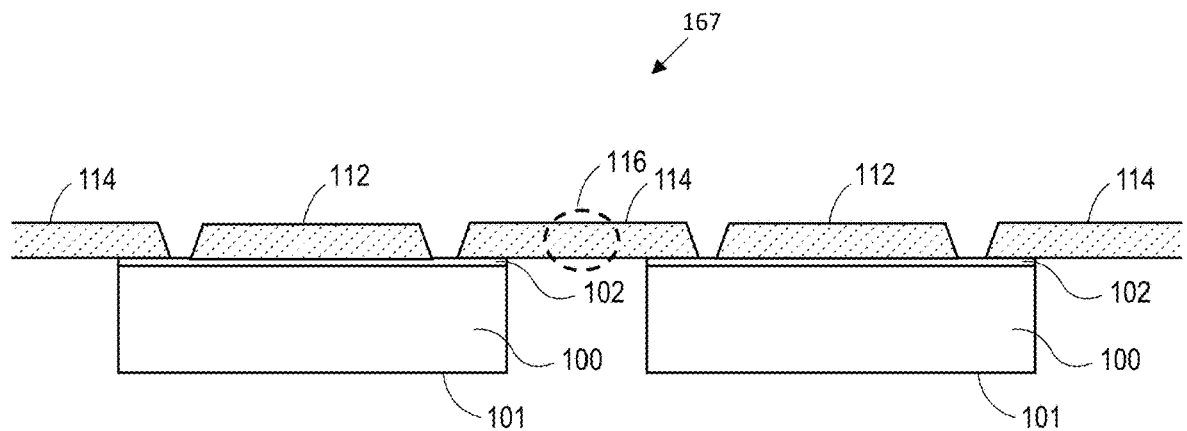
FIGS. 18A-18C illustrate cross-sectional views of a solar cell.

Referring to FIG. 18A, a side elevation view 90° into the page from FIG. 2D, there is shown a solar cell string 167. As shown, the edge portions 114 can also be referred to as interconnect portions which can electrically connect one solar cell to another solar cell. In one example, coupling one solar cell to another solar cell in this manner can form a solar cell string, achieving a parallel or series electrical relationship between the cells. In a particular embodiment, the overhang portion can represent a foil portion that is sufficiently large to overlap with one or more additional cells for metallization of the one or more additional cells. In an example, a single piece and/or sheet of foil can be used for a plurality of solar cells (e.g., 2, 3 or more solar cells) in this manner. In an embodiment, two or more cells can be connected together by their respective edge portions 114. For example, the edge portions 114 from adjacent cells can be connected by various processes at 116, such as by bonding, e.g., welding, and/or including conventional and laser bonding, laser welding, thermocompression bonding, soldering processes, and the like. In another example, substrates 100 can have individual edge portions 114. These individual edge portions 114 can be bonded and/or welded together to electrically connect one substrate to another, e.g., to form a solar cell string. In some examples, the individual edge portions 114 can be attached together using a conductive adhesive, tacking process, stamping process and/or any other type of applicable attachment process.

Figure 18B:
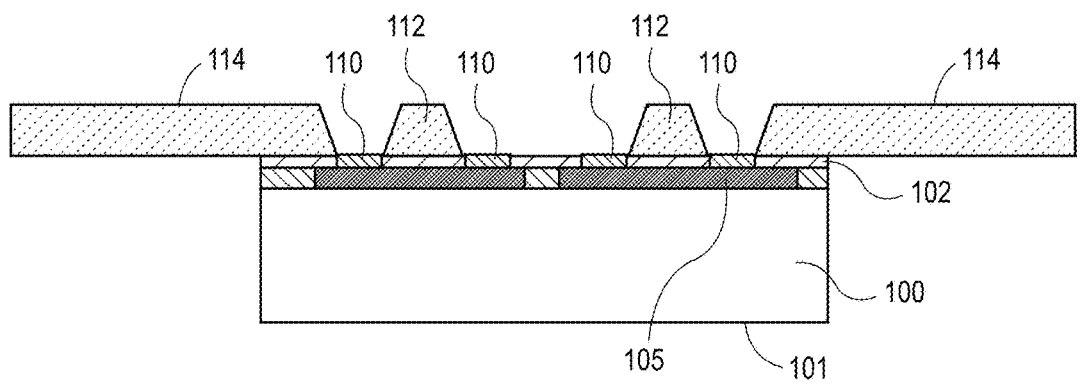

Referring to FIG. 18B, this figure schematically illustrates position of semiconductor regions 105. In an embodiment, as shown, the semiconductor regions can include a plurality of semiconductor regions such as first semiconductor regions, second semiconductor regions, etc. In an example, first semiconductor regions can be N-type semiconductor regions and the second semiconductor regions can be P-type semiconductor regions. In some examples, the semiconductor regions 105 can have the same conductivity type, e.g., are all N-type or P-type, as in some front contact solar cells. In an embodiment, the semiconductor regions 105 can include polycrystalline silicon. A thin dielectric layer, e.g., a tunnel oxide layer, can be disposed between the semiconductor regions 105 and the substrate 100.

Figure 18C:
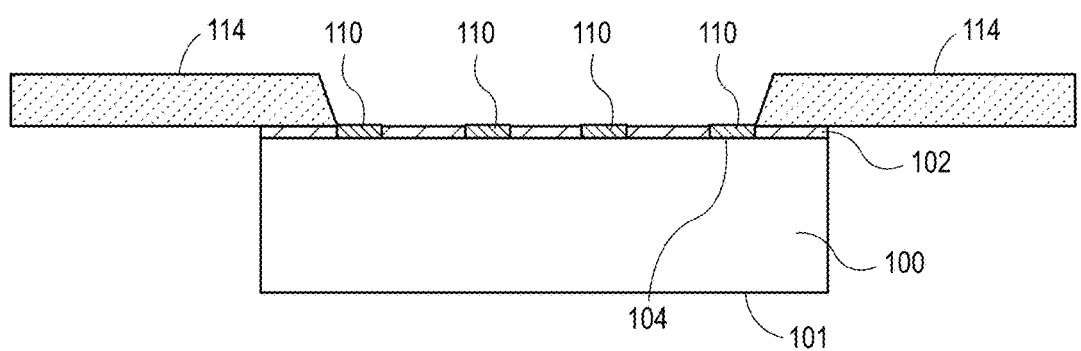

As illustrated in FIG. 18C, the semiconductor regions 105 are separated from one another laterally by a region 119. This region 119 can be a gap, an intrinsically doped region or a lightly doped region. Two openings in the intervening layer 102 for each of the semiconductor regions 105 are shown for connecting the conductive contact structures 110 to the semiconductor regions 105. The portions 112 electrically connect the conductive contact structures 110 for each of the semiconductor regions 105. In other words, the portion 112 on the left electrically connects the two left-most conductive contact structures 110 while the portion 112 on the right electrically connects the two right-most conductive contact structures 110. In specific example, the semiconductor regions 105 are N-type and/or P-type semiconductor regions and are separated by trenches formed there between, the trenches extending partially into the substrate, and covered by intervening layer 102. The separation can also be achieved by a lightly doped region 119, where the lightly doped regions can have a doping concentration substantially less than the N-type and/or P-type semiconductor regions. However, the semiconductor regions 105 can have the same conductivity type, are all N-type or P-type, as in some front contact solar cells. The portions 114 are edge portions and can be overhang portions, which can be used for coupling to another solar cell.

Figure 19A:
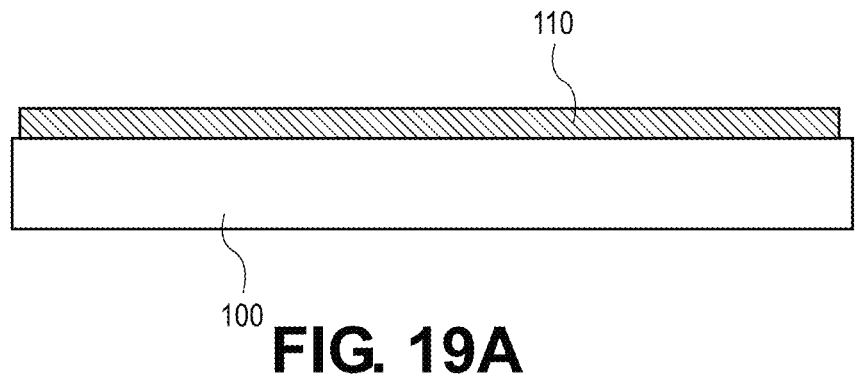
FIGS. 19A-19C illustrate side elevation views of a solar cell.
Figure 19B:
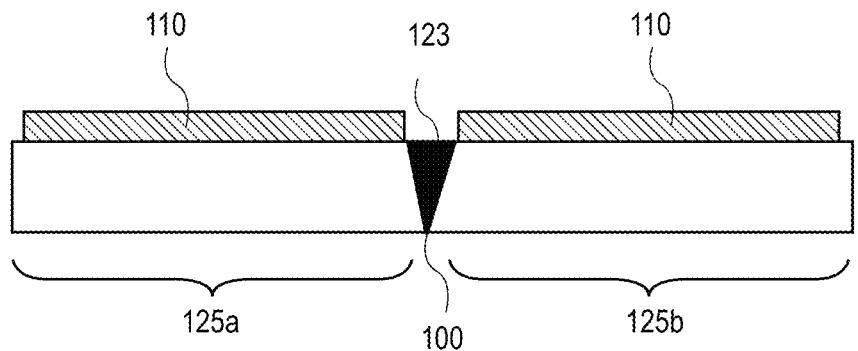
Figure 19C:
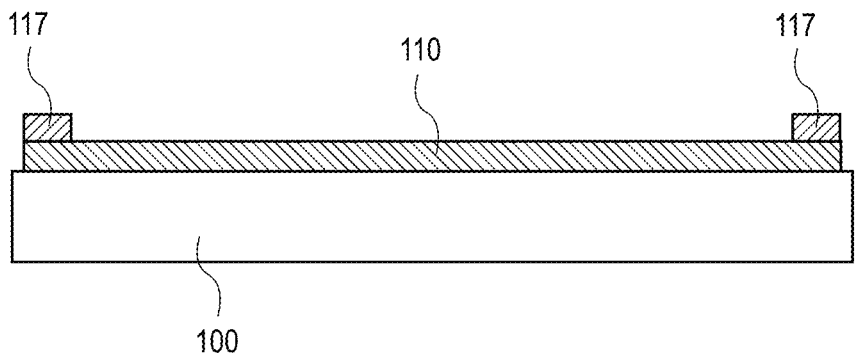

FIGS. 19A-19C show additional examples of a solar cell, in accordance with embodiments disclosed herein. FIG. 19A shows side view of a solar cell, in which the conductive contact structures 110 run the length of the substrate 100. Alternatively, FIG. 19B shows a pair of half cells 125a and 125b in which the conductive contact structures 110 run approximately half the length of the substrate 100. The conductive contact structures 110 can be formed continuously as shown in FIG. 19A and then laser scribed or otherwise ablated at 123 to for the two cells 125a and 125b. Alternatively, they can be formed as separate structures with no need to ablate the interconnecting foil FIG. 19C shows a side view of a solar cell, with busbars 117 that run transverse to the and conductive contact structures 110 conduct current across the conductive contact structures 110.

FIGS. 20A-20E illustrates example semiconductor substrates fabricated using methods, approaches or equipment described herein, according to some embodiments. The semiconductor substrates are solar cells 1520a-e and can include a silicon substrate 1525. The silicon substrate 1525 can be cleaned, polished, planarized and/or thinned or otherwise processed. The semiconductor substrate 1525 can be a single-crystalline or a multi-crystalline silicon substrate, N-type or P-type. The solar cells can have a front side 1502 and a back side 1504, where the front side 1502 is opposite the back side 1504. The front side 1502 can be referred to as a light receiving surface 1502 and the back side 1504 can be referred to as a back surface 1504. The solar cells can include a first doped region 1521 and a second doped region 1522. In an embodiment, the first doped region can be a P-type doped region (e.g., doped with boron) and the second doped region can be an N-type doped region (e.g., doped with phosphorus). The solar cells 1520a-e can include an intervening layer (e.g., anti-reflective coating ARC) 1528 on the front side 1502 of the solar cells. The solar cells 1520a-e can include a back intervening layer (e.g., back anti-reflective coating BARC) 1526 on the back side 1504 of the solar cells.

Figure 20A:
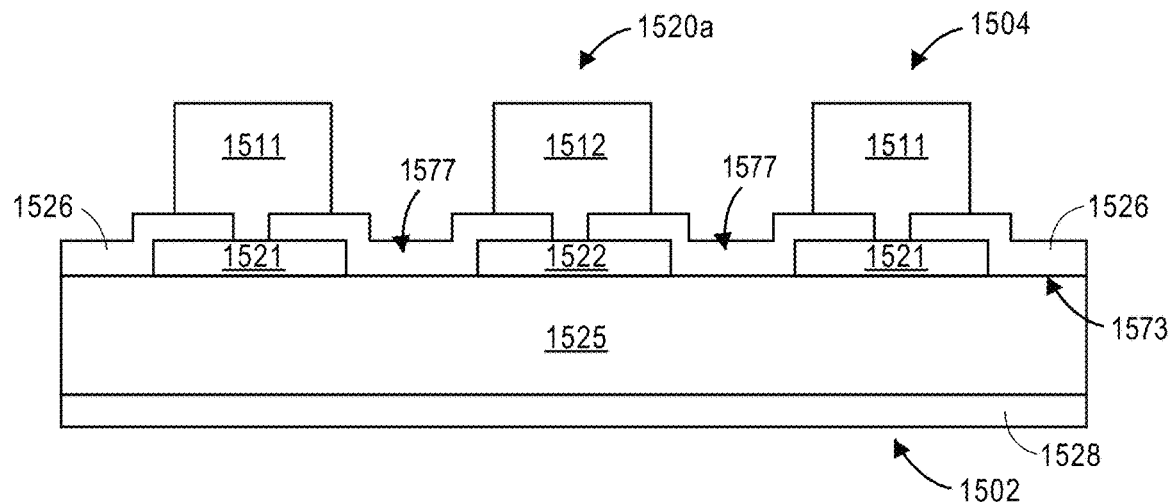
FIGS. 20A-20E illustrates example semiconductor substrates fabricated using methods, approaches or equipment described herein.

FIG. 20A illustrates an exemplary back-contact solar cell fabricated using methods, approaches or equipment described herein. The back-contact solar cell 1520a can include the first and second doped regions 1521, 1522 disposed on a back side 1504 of a solar cell 1520a. In an example, the first and second doped regions 1521, 1522 can be doped semiconductor regions. The first and second doped regions 1521, 1522 can be doped polysilicon regions. A thin oxide layer 1573 (e.g., tunnel oxide layer) can be disposed between the first and second doped regions 1521, 1522 and the substrate 1525. The first and second doped regions 1521, 1522 can, instead, be located in the substrate 1525. Conductive contact structures 1511, 1512 are located on the back side 1504 of the solar cell 1520a, where the conductive contact structures 1511, 1512 include locally deposited metal on the first and second doped regions 1521, 1522. The first and second doped regions 1521, 1522 can have separation regions 1577 formed there between. In an example, the first and second doped regions 1521, 1522 have trenches formed there between, the trenches extending partially into the substrate, and covered by intervening layer 1562. The trenches can be replaced with intrinsic or lightly doped semiconductor regions.

Figure 20B:
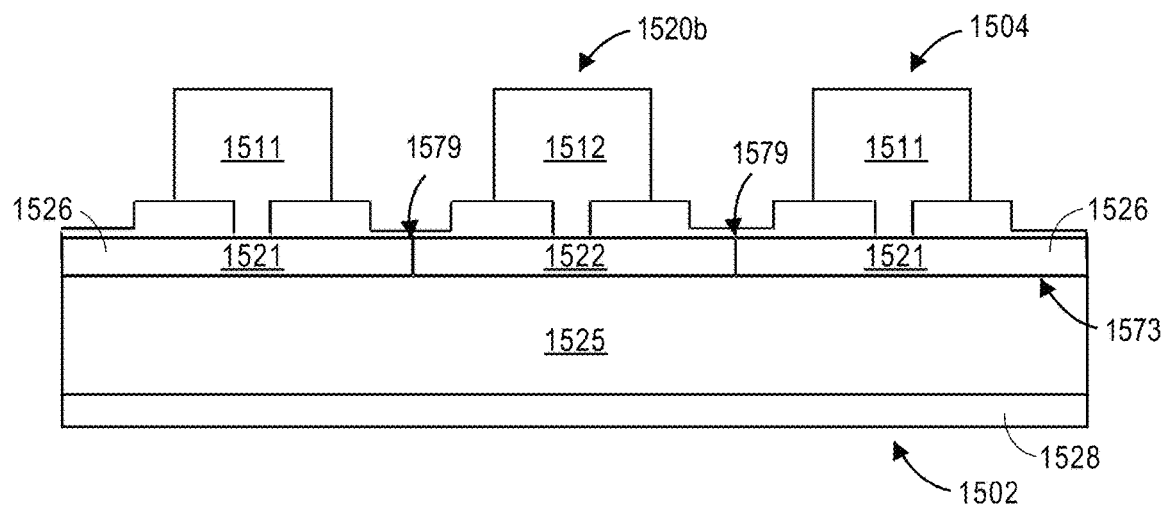

FIG. 20B illustrates another example of a back-contact solar cell 1520b fabricated using methods, approaches or equipment described herein, according to some embodiments. The back-contact solar cell 1520b can include the first and second doped regions 1521, 1522 disposed on a back side 1504 of a solar cell 1520b. In an example, the first and second doped regions 1521, 1522 can be doped semiconductor regions that extend in a continuous layer. In one example, first and second doped regions 1521,1522 are separated by a lightly doped region 1579 there between, e.g., where the lightly doped regions can have a doping concentration substantially less than the first and second doped regions 1521, 1522. In an embodiment, a thin oxide layer 1573 (e.g., tunnel oxide layer) can be disposed between the first and second doped regions 1521, 1522 and the substrate 1525. In a particular embodiment, the first and second doped regions 1521, 1522 can be doped polysilicon regions. The first and second doped regions 1521, 1522 can, instead, be located in the substrate 1525. In an embodiment, conductive contact structures 1511, 1512 on the back side 1504 of the solar cell 1520c, where the conductive contact structures 1511, 1512 include locally deposited metal on the first and second doped regions 1521, 1522 formed via a LAMP technique.

Figure 20C:
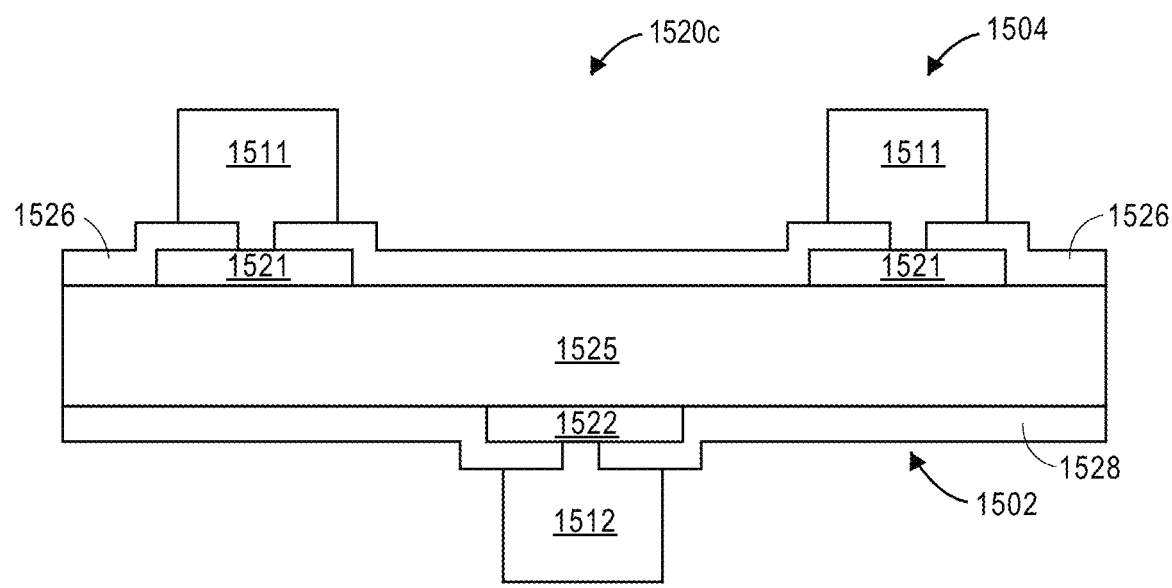

FIG. 20C illustrates an example front-contact solar cell fabricated using methods, approaches or equipment described herein, according to some embodiments. The front-contact solar cell 1520c can include the first doped regions 1521 disposed on the back side 1504 of the solar cell 1520c. In an example, the second doped region 1522 can be disposed on the front side 1502 of the solar cell 1520c. Although one example of a second doped region 1522 is shown, one or more, of the second doped region 1522 can be used. Conductive contact structures 1511, 1512 can be on the front and back sides 1504 of the solar cell 1520c, where the conductive contact structures 1511, 1512 include locally deposited metal on the first and second doped regions 1521, 1522 formed via a LAMP technique. The second doped region 1522 can offset from the first doped regions 1521, as shown. The second doped region 1522 can be aligned, e.g., vertically aligned with, the first doped regions 1521.

Figure 20D:
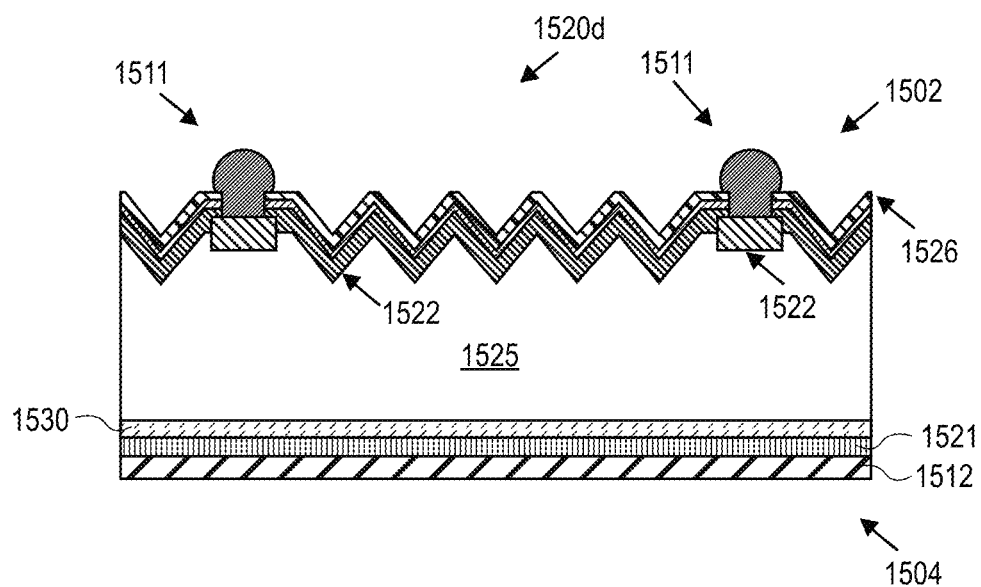

FIG. 20D illustrates an example front-contact solar cell fabricated using methods, approaches or equipment described herein, according to some embodiments. The front-contact solar cell 1520d can include the first doped regions 1521 disposed on the back side 1504 of the solar cell 1520d. Conductive contact structures 1511, 1512 can be formed via a LAMP technique on the front and back sides 1502, 1504 of the solar cell 1520d, respectively, where the conductive contact structures 1511, 1512 include locally deposited metal on the first and second doped regions 1521, 1522. The first and second doped regions 1521, 1522 can include an amorphous silicon region. The solar cell 1520d can include an intervening layer (e.g., an anti-reflective layer coating ARC) 1526 on the front side 1502 of the solar cell 1520d. The solar cells 1520d can include a back intervening layer (e.g., an back anti-reflective coating BARC) 1526 on the back side 1504 of the solar cell 1520d. A thin oxide layer 1530 can be disposed between the first doped region 1521 and the substrate 1525.

Figure 20E:
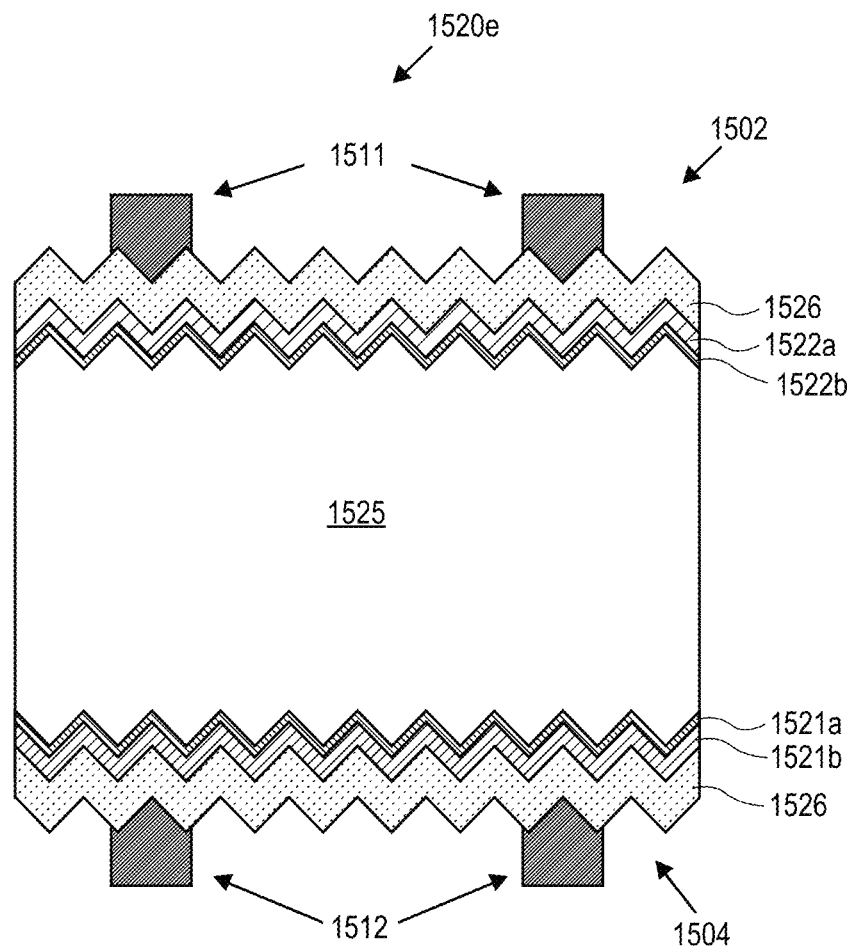

FIG. 20E illustrates another exemplary front-contact solar cell fabricated using methods, approaches or equipment described herein, according to some embodiments. The solar cell 1520e can include the first doped regions 1521a, 1521b disposed on the back side 1504 of the solar cell 1520*e*. In an example, the second doped region 1522*a*, 1522*b* can be disposed on the front side 1502 of the solar cell 1520*d*. In an embodiment, conductive contact structures 1511, 1512 can be formed via a LAMP technique on the front and back sides 1504 of the solar cell 1520*b*, respectively, where the conductive contact structures 1511, 1512 include locally deposited metal on the first and second doped regions 1521*a*, 1521*b*, 1522*a* 1522*b*. The first doped regions 1521*a*, 1521*b* can include a doped polysilicon region. The solar cell 1520*e* can include an intervening layer (e.g., an anti-reflective coating ARC) 1526 on the front side 1502 of the solar cell 1520*e*. The solar cells 1520*e* can include a back intervening layer (e.g., an back anti-reflective coating BARC) 1526 on the back side 1504 of the solar cell 1520*e*.

Although certain materials are described specifically with reference to above described embodiments, some materials can be readily substituted with others with such embodiments remaining within the spirit and scope of embodiments of the present disclosure. For example, in an embodiment, a different material substrate, such as a group III-V material substrate, can be used instead of a silicon substrate. In another embodiment, any type of substrate used in the fabrication of micro-electronic devices can be used instead of a silicon substrate, e.g., a printed circuit board (PCB) and/or other substrates can be used. Additionally, although reference is made significantly to back contact solar cell arrangements, it is to be appreciated that approaches described herein can have application to front contact solar cells as well. In other embodiments, the above described approaches can be applicable to manufacturing of other than solar cells. For example, manufacturing of light emitting diode (LEDs) can benefit from approaches described herein.

Additionally, although solar cells are described in great detail herein, the methods and/or processes described herein can apply to various substrates and/or devices, e.g., semiconductor substrates. For example, a semiconductor substrate can include a solar cell, light emitting diode, micro-electromechanical systems and other substrates.

Furthermore, although many embodiments described pertain to directly contacting a semiconductor with a metal foil as a metal source. Concepts described herein can also be applicable to solar applications (e.g., HIT cells) where a contact is made to a conductive oxide, such as indium tin oxide (no), rather than contacting a semiconductor directly. Additionally, embodiments can be applicable to other patterned metal applications, e.g., PCB trace formation.

Thus, local metallization of semiconductor substrates using a laser beam, and the resulting structures.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:
    forming an intervening layer above a substrate, the intervening layer having openings exposing portions of the substrate;
    locating a metal foil over the openings in the intervening layer;
    exposing the metal foil to a laser beam, wherein exposing the metal foil to the laser beam forms a plurality of conductive contact structures each having a locally deposited metal portion electrically connected to portions of the substrate, wherein portions of the metal foil are not exposed to the laser beam;
    locating a carrier sheet over the metal foil;
    bonding the carrier sheet to the metal foil by soldering the carrier sheet to the metal foil; and
    removing the carrier sheet from the metal foil to selectively remove the portions of the metal foil that are not exposed to the laser beam.

2. The method of claim 1, wherein removing the carrier sheet comprises mechanically removing the carrier sheet.

3. The method of claim 2, wherein removing the carrier sheet comprises using compressed air, a water jet, or by drawing up the carrier sheet by vacuum.

4. The method of claim 1, wherein removing the carrier sheet tears the metal foil leaving an edge feature on the first regions.

5. The method of claim 1, wherein the carrier sheet comprises a second metal foil.

6. The method of claim 1, wherein the carrier sheet comprises a polymer.

\* \* \* \* \*